(12) United States Patent
Clinton et al.

(10) Patent No.: US 8,379,465 B2
(45) Date of Patent: Feb. 19, 2013

(54) COMBINED WRITE ASSIST AND RETAIN-TILL-ACCESSED MEMORY ARRAY BIAS

(75) Inventors: Michael Patrick Clinton, Allen, TX (US); Lakshmikantha V. Holla, Bangalore (IN); Vinod Menezes, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 256 days.

(21) Appl. No.: 12/764,399

(22) Filed: Apr. 21, 2010

(65) Prior Publication Data

US 2011/0261632 A1 Oct. 27, 2011

(51) Int. Cl.
G11C 7/00 (2006.01)
G11C 11/00 (2006.01)
G11C 5/14 (2006.01)

(52) U.S. Cl. ............... 365/189.11; 365/154; 365/189.14; 365/227

(58) Field of Classification Search .................. 365/154, 365/155, 156, 189.11, 227
See application file for complete search history.

(56) References Cited

U.S. PATENT DOCUMENTS

| 7,376,038 B2 | 5/2008 | Thiruvengadam et al. |
| 7,385,841 B2 | 6/2008 | Houston |
| 7,453,743 B2 | 11/2008 | Houston |
| 7,596,012 B1 | 9/2009 | Su et al. |
| 2007/0035987 A1* | 2/2007 | Houston ....................... 365/154 |
| 2009/0258471 A1 | 10/2009 | Sadra et al. |

OTHER PUBLICATIONS

Yamaoka et al., "Low-Power Embedded SRAM Modules with Expanded Margins for Writing", Paper No. 26.4, Tech. Digest of Int'l Solid-State Circuits Conference (IEEE, 2005), pp. 480-481, 611.

* cited by examiner

*Primary Examiner* — Ly D Pham
(74) *Attorney, Agent, or Firm* — Rose Alyssa Keagy; Wade J. Brady, III; Frederick J. Telecky, Jr.

(57) ABSTRACT

Bias circuitry for a static random-access memory (SRAM) with a retain-till-accessed (RTA) mode and with write assist bias in a normal operating mode. The memory is constructed of multiple memory array blocks of SRAM cells. Bias devices are associated with each memory array block, and associated with one or more columns. Each bias device includes a diode-connected transistor in parallel with a shorting transistor, between a power supply voltage and a power supply bias node for cells in its column or columns. The shorting transistor receives control signals from control logic so that the diode-connected transistor for each column is shorted during read cycles, and in write cycles in which its columns are not selected; in write cycles in which its columns are selected, the shorting transistor in the bias device is turned off, so that a reduced power supply voltage is applied to the selected column. The shorting transistors for all columns in the block are turned off in the RTA mode. An additional transistor in series with the diode-connected transistor may be included, to enable a floating power supply bias mode.

19 Claims, 10 Drawing Sheets

COMBINED WRITE ASSIST AND RETAIN-TILL-ACCESSED MEMORY ARRAY BIAS

CROSS-REFERENCE TO RELATED APPLICATIONS

This application is related to commonly assigned U.S. patent application Ser. No. 12/764,369 entitled "Reduced Power Consumption in Retain-Till-Accessed Static Memories", and Ser. No. 12/764,426 entitled "Retain-Till-Accessed Power Saving Mode in High Performance Static Memories", both filed contemporaneously herewith and incorporated herein by reference.

STATEMENT REGARDING FEDERALLY SPONSORED RESEARCH OR DEVELOPMENT

Not applicable.

BACKGROUND OF THE INVENTION

This invention is in the field of integrated circuits. Embodiments of this invention are more specifically directed to solid-state static random access memories (SRAMs), and power reduction in those SRAMs.

Many modern electronic devices and systems now include substantial computational capability for controlling and managing a wide range of functions and useful applications. Many of these electronic devices and systems are now hand-held portable devices. For example, many mobile devices with significant computational capability are now available in the market, including modern mobile telephone handsets such as those commonly referred to as "smartphones", personal digital assistants (PDAs), mobile Internet devices, tablet-based personal computers, handheld scanners and data collectors, personal navigation devices, and the like. Of course, these systems and devices are battery powered in order to be mobile or handheld. The power consumption of the electronic circuitry in those devices and systems is therefore of great concern, as battery life is often a significant factor in the buying decision as well as in the utility of the device or system.

The computational power of these modern devices and systems is typically provided by one or more processor "cores", which operate as a digital computer in carrying out its functions. As such, these processor cores generally retrieve executable instructions from memory, perform arithmetic and logical operations on digital data that are also retrieved from memory, and store the results of those operations in memory; other input and output functions for acquiring and outputting the data processed by the processor cores are of course also provided. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM memory cells store contents "statically", in that the stored data state remains latched in each cell so long as power is applied to the memory; this is in contrast to "dynamic" RAM ("DRAM"), in which the data are stored as charge on solid-state capacitors, and must be periodically refreshed in order to be retained.

Advances in semiconductor technology in recent years have enabled shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues in connection with such embedded memory.

One such problem is the substantial DC current due to sub-threshold leakage and other short channel effects of the transistors in SRAM cells, resulting in increased DC data retention current drawn by embedded memory arrays. Designers have recently adopted circuit-based approaches for reducing power consumed by integrated circuits including large memory arrays. One common approach is to reduce the power supply voltage applied to memory arrays, relative to the power supply voltage applied to logic circuitry and circuitry peripheral to the memory array (e.g., decoders, sense amplifiers, etc.). This approach not only reduces the power consumed by the memory array, but also helps to reduce sub-threshold leakage in the individual cells.

Another circuit-based approach to reducing power consumption involves placing the memory functions within the integrated circuit into a retention state when possible. In conventional memory retention states, the power supply voltages applied to the memory array are reduced to voltages below that necessary for access, but above the minimum required for data states to be retained in the memory cells (i.e., above the data-state retention voltage, or "DRV"); memory peripheral circuits are also powered down in this full retention mode, saving additional power. Typically, the "$V_{dd}$" power supply voltage applied to the loads of SRAM cells (e.g., the source nodes of the p-channel transistors in CMOS SRAM cells) is reduced in this retention mode; well bias voltages may also be modulated in this retention mode, for example to increase transistor threshold voltages and thus further reduce device leakage. However, significant recovery time is typically involved in biasing the memory array to an operational state from the retention state.

Recently, an intermediate power-down mode has been implemented in integrated circuits with memory arrays of significant size. This intermediate mode is referred to in the art as "retain-till-accessed", or "RTA", and is most often used in those situations in which the memory arrays are split into multiple blocks. In the RTA mode, the peripheral memory circuitry remains fully powered and operational. However, only those block or blocks of the memory array that are being accessed are fully powered; other blocks of the memory that are not being accessed are biased to a reduced array power supply voltage (i.e., above the retention voltage) to reduce power consumption while idle. Well and junction biases (i.e., other than the bias of p-channel MOS source nodes that receive the reduced RTA bias) are typically maintained at the same voltages in RTA mode as in read/write operation, to reduce the recovery time from RTA mode. The power saving provided by the RTA mode can be substantial, especially if some of the larger memory blocks are accessed infrequently. Because of its ability to be applied to individual blocks within a larger-scale integrated circuit, as well as its fast recovery time, the RTA standby mode is now often used with embedded memories in modern mobile Internet devices and smartphones, considering that these devices remain powered-on but not fully active for much of their useful life.

From a circuit standpoint, integrated circuit memories having an RTA mode must include circuitry that establishes the reduced RTA array bias voltage, and that switchably controls entry into and exit from RTA mode during operation. FIG. 1a is a block diagram of a conventional integrated circuit 2 in which such RTA standby is provided. Integrated circuit 2 includes memory array 5, arranged into multiple memory array blocks $6_0$ through $6_3$ of different sizes relative to one another. Each memory array block 6 is associated with corresponding decode and read/write circuitry 11 that addresses, writes data to, and reads data from its associated memory array block 6. Integrated circuit 2 also includes functional and power management circuitry 4, which includes the logic functionality provided by integrated circuit 2, and also circuitry for regulating and distributing power supply voltages throughout integrated circuit 2. For purposes of this example of memory array 5, functional and power management circuitry 4 produces a voltage on power supply line $V_{ddm}$ that is sufficient for memory read and write operations. Functional and power management circuitry 4 also produces a "periphery" power supply voltage on power supply line $V_{dd}P$, which is applied to decoder and read/write circuitry 11 and is typically at a different voltage from that of the power supply voltage on line $V_{ddm}$ applied to memory array 5 during reads and writes, as known in the art. The actual array power supply voltage applied to each memory array block $6_0$ through $6_3$ is presented on power supply lines $V_{dd}AR_0$ through $V_{dd}AR_3$, respectively. The voltages on lines $V_{dd}AR_0$ through $V_{dd}AR_3$ are defined by way of bias/switch circuits $7_0$ through $7_3$, respectively, and based on the voltage at power supply line $V_{ddm}$, as will be described below.

Each memory array block 6 in this conventional integrated circuit 2 is constructed as an array of SRAM cells arranged in rows and columns. As shown in FIG. 1b by the example of six-transistor (6-T) memory cell $12_{j,k}$, which is in the $j^{th}$ row and $k^{th}$ column of one of memory array blocks 6, each SRAM memory cell 12 is biased between the voltage on power supply line $V_{dd}AR$ and a reference voltage (e.g., at ground reference $V_{ss}$). SRAM memory cell $12_{j,k}$ in this case is constructed in the conventional manner as a pair of cross-coupled CMOS inverters, one inverter of series-connected p-channel transistor 13p and n-channel transistor 13n with their drains at node S1, and the other inverter of series-connected p-channel transistor 14p and n-channel transistor 14n with their drains at node S2; the gates of the transistors in each inverter are connected together and to the common drain node of the transistors in the other inverter, in the usual manner. N-channel pass transistors 15a, 15b have their source/drain paths connected between respective cross-coupled nodes S1, S2 and a corresponding one of complementary bit lines $BL_k$, $BL^*_k$, respectively; the gates of pass transistors 15a, 15b are driven by word line $WL_j$ for the row. Accordingly, as known in the art, DC current drawn by SRAM cell $12_{j,k}$ amounts to the sum of the off-state source/drain leakage currents through one of p-channel transistors 13p, 14p and one of n-channel transistors 13n, 14n, plus any gate oxide leakage that may be present. As mentioned above, if transistors 13, 14 are extremely small sub-micron devices, these leakage currents can be significant (as much as 1 nA per memory cell), and can thus result in significant overall standby power consumption if the number of memory cells 12 in memory array blocks 6 is large.

Referring back to FIG. 1a, memory array blocks $6_0$ through $6_3$ may be independently biased into RTA mode in this conventional integrated circuit 2, by operation of bias/switch circuits $7_0$ through $7_3$, respectively. The construction of bias/switch circuit $7_1$ is illustrated in FIG. 1a by way of example. P-channel transistor 8 is connected in diode fashion, with its source at power supply line $V_{ddm}$ and its drain and gate connected to node $V_{dd}AR_1$; the voltage drop across transistor 8 from the voltage at line $V_{ddm}$ thus establishes voltage on power supply line $V_{dd}AR_1$. In some cases, transistor 8 is realized as an n-channel MOS transistor connected in diode fashion. Shorting transistor 9 is a relatively large p-channel power transistor with its source/drain path connected between power supply line $V_{ddm}$ and power supply line $V_{dd}AR_1$, and its gate receiving control signal $RTA_1$ from functional and power management circuitry 4. If memory array block $6_1$ is being accessed for a read or write operation, control signal $RTA_1$ is driven to a low logic level, which turns on transistor 9 in bias/switch circuit $7_1$ and shorts out diode 8, setting the voltage at line $V_{dd}AR_1$ at that of power supply line $V_{ddm}$. Conversely, if memory array block $6_1$ is to be placed in RTA mode, functional and power management circuitry 4 will drive control signal $RTA_1$ to a high logic level. This turns off transistor 9 in bias/switch circuit $7_1$, such that the voltage drop across diode 8 establishes the voltage at node $V_{dd}AR_1$ at a lower voltage (by one diode drop) than the voltage at power supply line $V_{ddm}$. In this RTA mode, therefore, the power consumed by memory array block $6_1$ will be reduced by an amount corresponding to at least the square of this voltage reduction. Meanwhile in this RTA mode, periphery power supply line $V_{dd}P$ applied to peripheral memory circuitry, such as decoder and read/write circuitry 11 for each memory array block 6, carries its normal operating voltage, so that this peripheral circuitry is ready to perform an access of its associated memory array block.

A second problem encountered in connection with embedded SRAM memory now realized by modern manufacturing technology stems from the increased variability in the electrical characteristics of transistors formed at these extremely small feature sizes. This variability in characteristics has been observed to increase the likelihood of read and write functional failures, on a cell-to-cell basis. The combination of increased device variability with the larger number of memory cells (and thus transistors) within an integrated circuit renders a higher likelihood that one or more cells cannot be read or written as expected.

A particular failure mode that has been observed in conventional modern SRAM memories is the failure to switch the state of an SRAM cell in a write operation. Typically, this failure has been observed to be due to the inability of write circuitry to pull down the sense node currently latched to a high voltage. Referring to SRAM cell $12_{j,k}$ of FIG. 1b, consider the case in which node S1 is at a high level and node S2 is at a low level, with word line $WL_j$ turned off. In order to write the opposite state into SRAM cell $12_{j,k}$, write circuitry operates to pull down bit line $BL_k$ toward $V_{ss}$ while word line $WL_j$ is turned on. If device imbalances within SRAM cell $12_{j,k}$ render the write circuitry incapable of "flipping" the state of SRAM cell $12_{j,k}$ in this manner, the write operation will fail and node S1 will remain latched at a high level despite the attempted write operation.

A circuit-based approach to reducing the likelihood of write failures in modern SRAM memories is referred to in the art as "write assist". FIG. 1c illustrates one example of conventional write assist circuitry in an SRAM memory. In FIG. 1c, 6-T SRAM cells 12 in two columns k, k+1, and three rows j, j+1, j+2 in memory array block $6_m$ are shown by way of example; it will be understood, of course, that many more rows and columns of SRAM cells 12 will typically be present in a given memory array block. SRAM cells 12 in the same row share the same word line (e.g., SRAM cells $12_{j,k}$ and $12_{j,k+1}$ each receive word line $WL_j$), and SRAM cells in the same column are coupled to the same bit line pair (e.g., SRAM cells $12_{j,k}$, $12_{j+1,k}$, $12_{j+2,k}$ are each connected to bit lines $BL_k$, $BL^*_k$). For purposes of write assist, columns k, k+1 are associated with a write assist transistor $17_k$, $17_{k+1}$, respectively. In this conventional arrangement, the number of write assist transistors 17 equals the number of columns of SRAM cells 12. Each write assist transistor $17_k$, $17_{k+1}$ is constructed as a p-channel MOS (i.e., PMOS) transistor, each with its source connected to power supply node $V_{dd}$. Write assist transistor $17_k$ has its drain connected to power supply line $V_{ddm}$[k], which provides the "$V_{dd}$" bias to each of SRAM cells 12 in column k; similarly, write assist transistor $17_{k+1}$ has its drain connected to power supply line $V_{ddm}$[k+1], which biases SRAM cells in column k+1. As such, separate $V_{dd}$ bias is provided to each column of SRAM cells 12 in this arrangement. The gate of write assist transistor $17_k$ receives write control signal WR[k], and the gate of write assist transistor $17_{k+1}$ receives write control signal WR[k+1].

This conventional write assist approach operates to float the $V_{dd}$ bias to SRAM cells 12 in columns that are being written. More specifically, with reference to FIG. 1c, write control signals WR[k], WR[k+1] remain inactive low during read cycles, standby periods, or write operations to other columns. Write assist transistors $17_k$, $17_{k+1}$ remain turned on by write control signals WR[k], WR[k+1] remaining inactive low during these times, allowing each of SRAM cells 12 in columns k, k+1 to be biased from power supply node $V_{dd}$. In the event of a write operation to an SRAM cell 12 in column k, write control signal WR[k] is driven active high, while write control signal WR[k] remains inactive low (no write is being performed to column k+1 in this example). The active high level on write control signal WR[k] turns off write assist transistor $17_k$, isolating power supply line $V_{ddm}$[k] from power supply node $V_{dd}$. This floating state on power supply line $V_{ddm}$[k] allows a low logic level on the desired one of bit lines $BL_k$, $BL^*_k$ to more easily flip the state of the SRAM cell 12 in the selected row of column k, as that low level bit line will not be "fighting" the high voltage bias from power supply node $V_{dd}$. Rather, the drive of the p-channel transistor 13p, 14p that has been maintaining the "1" level at its drain is weakened by the floating state on power supply line $V_{ddm}$[k] in this write assist operation. Meanwhile, the voltage at power supply node $V_{dd}$ remains biasing SRAM cells 12 in column k+1 since write assist transistor $17_{k+1}$ remains on; this maintains the previously latched data states in that column k+1.

FIG. 1d illustrates, by way of simulation, how this floating $V_{dd}$ approach is effective in allowing "weak" SRAM cells to properly write a data state. In the timing diagram of FIG. 1d, during the time period between time $t_0$ and time $t_1$, write assist transistor $17_k$ is turned off during a write operation to a weak (e.g., imbalanced) SRAM cell $12_{j,k}$; word line $WL_j$ is turned on during this operation, selecting row j. In this example, prior to time $t_0$, SRAM cell $12_{j,k}$ has latched a high level on node S1 and a low level on node S2; the write will attempt to flip that state to its opposite. As evident in the time period of the write, between time $t_0$ and time $t_1$, power supply line $V_{ddm}$[k] is slightly discharged by the attempt to change the state of node S2 from low to high (by discharging node S1 to the low level of bit line $BL_k$). The voltage at node S2 increases slightly as, in this case, transistor 14p is turned on by the low level on bit line $BL_k$ (via pass transistor 15a), but that voltage on node S2 does not reach a level sufficient to turn off cross-coupled transistor 13p in SRAM cell $12_{j,k}$. This inability to change the state of SRAM cell $12_{j,k}$ is due to an imbalance in SRAM cell $12_{j,k}$ that allows the voltage on power supply line $V_{ddm}$[k] to overpower the low level on bit line $BL_k$. Upon the end of this write period, at time $t_1$, node S2 returns to its previously low level. The write has failed.

In this simulation of this conventional write assist approach, write assist transistor $17_k$ is turned on during the write between time $t_2$ and time $t_3$, allowing power supply line $V_{ddm}$[k] to float. The write is then attempted again by the low level at bit line $BL_k$ in combination with an active level on word line $WL_j$, at time $t_2$. In this case, because power supply line $V_{ddm}$[k] is floating, the low level on bit line $BL_k$ is able to pull node S1 sufficiently low that transistor 14p turns on, charging node S2 to a high enough voltage that the state of SRAM cell $12_{j,k}$ flips. At the end of the write operation at time $t_3$, this new state of SRAM cell $12_{j,k}$ is latched.

While this conventional write assist approach allows a weak cell to be written, as described above, it has been observed that this approach involves substantial power consumption. As evident from FIG. 1d, the voltage of power supply line $V_{ddm}$[k] has been discharged substantially, on the order of 175 mV in this simulation example. This discharge similarly occurs on each column written, regardless of whether a weak bit is present. At the end of the assisted write, upon write assist transistors 17 again being turned on, each power supply line $V_{ddm}$[k] is then charged back to its full power supply voltage $V_{dd}$, which of course consumes power in each write operation.

Another conventional write assist approach applies a reduced clamped voltage to the entire memory array block during writes to that memory array block, and also applies a reduced power supply voltage in a power-down mode. An example of this clamped approach is shown in FIG. 1e, in connection with memory array block $6_m$ in which 6-T SRAM cells 12 are arranged in rows and columns, as described above. In this conventional approach, bias circuit $18_m$ is associated with memory array block $6_m$, and derives a voltage on power supply line $V_{ddm}$, which is connected to all SRAM cells 12 in memory array block $6_m$. As such, a single instance of bias circuit $18_m$ is provided for each memory array block $6_m$, in contrast to the arrangement of FIG. 1c in which write assist transistors 17 are provided for individual columns.

In this example, bias circuit $18_m$ includes p-channel MOS transistor 22 with its source at power supply voltage $V_{dd}$, and its gate receiving power down signal PD[m] for memory array block $6_m$. A complementary MOS (CMOS) inverter consists of p-channel MOS transistor 25p with its source connected to the drain of transistor 22, and its drain connected to the drain of n-channel MOS transistor 25n; the gates of transistors 25p, 25n are connected in common to receive write enable signal WE[m], which indicates that a write operation is to be performed to one or more SRAM cells 12 in memory array block $6_m$. A diode chain of p-channel MOS transistors 25d1, 25d2, with their source-drain paths connected in series between the source of n-channel transistor 25n and ground; transistors 25d1, 25d2 each has its gate connected to its drain, in diode fashion. Transistor 25d3 is also connected in diode fashion (gate connected to drain), with its source at power supply voltage $V_{dd}$ and its drain and gate connected to the common drain node of transistors 25p, 25n, at power supply line $V_{ddm}$.

In normal operation for read operations, both of control signals PD[m], WE[m] are inactive low. This turns on both of transistors 22 and 25p, and turns off transistor 25n; in this state, power supply line $V_{ddm}$ is at the full voltage of the $V_{dd}$ power supply. In a power-down mode, control signal PD[m] is driven active high while control signal WE[m] remains inactive low. In this case, transistors 22 and 25n are both turned off, causing the voltage at power supply line $V_{ddm}$ to be at one diode threshold voltage below the $V_{dd}$ power supply voltage, through the action of diode-connected transistor 25d3. As such, all of SRAM cells 12 in memory array block 6$_m$ are biased to this lower voltage V$_{dd}$-V$_t$ in this power-down mode.

Write assist is accomplished, in this conventional circuit arrangement, upon control signal WE[m] being driven active high for a write to one of SRAM cells 12 in memory array block 6$_m$, while power-down control signal PD[m] remains inactive low. This turns off transistors 25p (and 22), allowing the voltage at power supply line V$_{ddm}$ to be pulled down toward ground through the series diode connection of 25d1, 25d2. The resulting voltage at power supply line V$_{ddm}$ will depend on the characteristics of diode-connected transistors 25d1, 25d2, 25d3, as well as the on resistance of transistor 25n. But it is contemplated that, in the steady-state, the voltage of power supply line V$_{ddm}$ will generally approach two threshold voltages above ground. As described above, all of SRAM cells 12 within memory array block 6$_m$ will receive this reduced power supply voltage during write operations.

Upon completion of the write operation using the conventional technique of FIG. 1e, power supply line V$_{ddm}$ must be charged back up to its full V$_{dd}$ level. As a result, while this conventional arrangement assists in the writing of weak SRAM cells 12, by reducing the voltage against which the cross-coupled nodes are pulled low, substantial power is consumed by the repeated discharging and charging of power supply line V$_{ddm}$ for the entire memory array block 6$_m$.

BRIEF SUMMARY OF THE INVENTION

Embodiments of this invention provide a static random access memory (SRAM) in which features of write assist power supply bias and a reduced array bias in a retain-till-accessed (RTA) are efficiently provided to the SRAM arrays.

Embodiments of this invention provide such an SRAM in which write assist power consumption is reduced relative to conventional write assist circuitry, by way of a self-regulating mechanism.

Embodiments of this invention provide such an SRAM in which write disturb errors in adjacent unselected columns sharing a sense amplifier with the selected column are avoided.

Other objects and advantages provided by embodiments of this invention will be apparent to those of ordinary skill in the art having reference to the following specification together with its drawings.

Embodiments of this invention can be realized by constructing a static random access memory (SRAM) array in which a bias device is series-connected between a power supply voltage and the load transistors in each memory cell of a given column of the array, with a switching transistor in parallel with that bias device for each column. The memory array can be constructed in multiple memory array blocks. In operation, the switching transistors short out corresponding bias devices during read operations, and at other times in which the memory array block is to be fully powered. In RTA mode for the memory array block, all switching devices for that memory array block are turned off, allowing the bias device to the SRAM cells to be defined by the voltage drop across the corresponding bias devices. In write cycles, the switching devices for selected columns are turned off, allowing the reduced power supply voltage to bias the selected cells in those columns. The switching devices for unselected columns can be turned on, providing full power supply bias to unselected columns and reducing the likelihood of write disturb errors in shared sense amplifier architectures.

BRIEF DESCRIPTION OF THE SEVERAL VIEWS OF THE DRAWING

FIG. 1b is an electrical diagram, in schematic form, of a memory cell in the conventional integrated circuit of FIG. 1a.

DETAILED DESCRIPTION OF THE INVENTION

The present invention will be described in connection with its preferred embodiment, namely as implemented into an integrated circuit including an embedded memory array, and constructed according to complementary metal-oxide-semiconductor (CMOS) technology. However, it is contemplated that the benefits of this invention may be attained when realized in other applications and constructed according to other technologies. Accordingly, it is to be understood that the following description is provided by way of example only, and is not intended to limit the true scope of this invention as claimed.

Figure 2A:
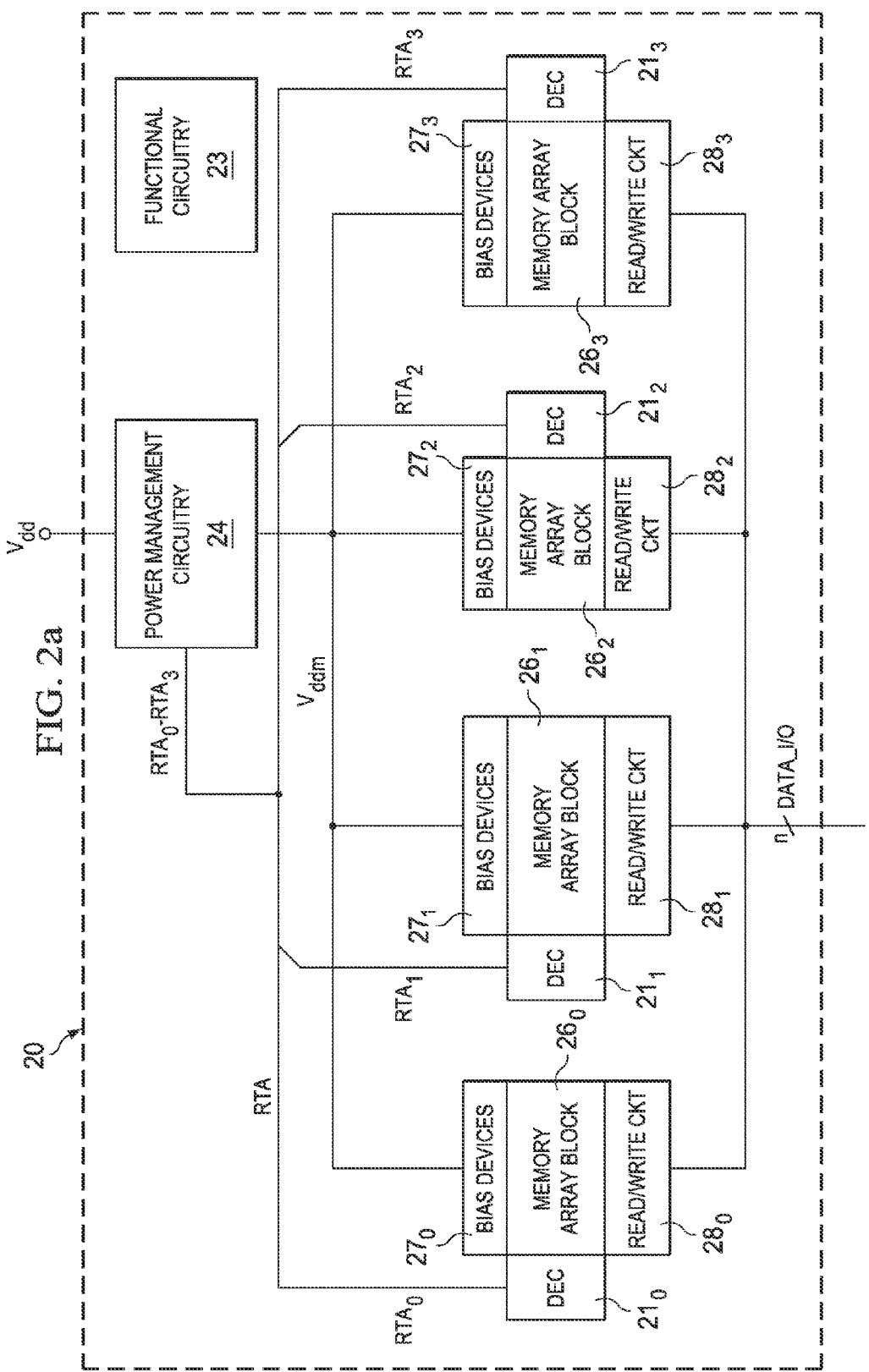
FIGS. 2a and 2b are electrical diagrams, in block form, of an integrated circuit including a memory array constructed according to embodiments of this invention.

Referring now to FIG. 2a, by way of example, integrated circuit 20 constructed according to embodiments of this invention will now be described at a block diagram level. As shown in FIG. 2, integrated circuit 20 includes functional circuitry 23, power management circuitry 24, and memory array blocks 26. The functionality provided by functional circuitry 23 may vary widely depending on the desired application. For example, if integrated circuit 20 is a large-scale device such as a "system on a chip", functional circuitry 23 may correspond to programmable logic circuitry such as a microprocessor or digital signal processor core, along with the corresponding support and interface circuitry of which memory array blocks 26 would serve as an embedded memory resource; at another extreme, integrated circuit 20 may be a stand-alone memory device, in which case functional circuitry 23 would provide the support and interface circuitry for accessing memory array blocks 26. As such, in embodiments of this invention, the construction and capability of functional circuitry 23 can correspond to any of a wide array of possibilities.

According to embodiments of this invention, multiple memory array blocks $26_0$ through $26_3$ are provided. In this example, memory array blocks $26_0$ through $26_3$ are of different sizes relative to one another, but of course need not be. In this example, memory array blocks $26_0$ through $26_3$ may each have on the order of sixteen to sixty-four rows of memory cells, arranged in from as few as sixteen columns to more than 512 columns. While four memory array blocks $26_0$ through $26_3$ are shown, this memory resource may be realized by as few as one memory block 26, or by more than four memory array blocks $26_0$ through $26_3$, depending on the particular application. Each memory array block 26 is associated with corresponding decode circuitry 21, which is involved in the addressing of memory cells in its associated memory array block 26. Each memory array block 26 is also associated with an instance of read/write circuitry 28, by way of which the contents of selected memory cells within the corresponding memory array block 26 are sensed and forwarded to data bus DATA_I/O, and by way of which input data presented on data bus DATA I/O are written into selected memory cells of memory array block 26. Other circuitry (not shown) useful in connection with the addressing of memory cells in memory array blocks 26, and the communication of data to and from those memory cells, is also provided within integrated circuit 20, as well known in the art.

Power management circuitry 24 regulates and distributes power supply voltages throughout integrated circuit 20. According to embodiments of this invention, power management circuitry 24 applies a power supply voltage to power supply line $V_{ddm}$ that is sufficient to enable read and write operations to memory cells within memory array blocks 26. Power management circuitry 24 also produces and controls other power supply voltages, including a periphery power supply voltage for biasing decoder circuitry 21, read/write circuitry 28, functional circuitry 23, and the like. Typically, power management circuitry 24 generates these power supply voltages, including the voltage on power supply line $V_{ddm}$, from an external power supply voltage, which in this case is shown in FIG. 2a by external power supply terminal $V_{dd}$. Power management circuitry 24 may also include charge pump circuits or other functions that provide negative or other reference bias voltages, for example as applied to wells or substrate connections within integrated circuit 20, as conventional in the art.

In connection with embodiments of this invention, memory array blocks $26_0$ through $26_3$ are associated with corresponding sets of bias devices $27_0$ through $27_3$, respectively, each of which receive power supply line $V_{ddm}$ from power management circuitry 24. As will be described in further detail below, bias devices $27_0$ through $27_3$ generate, from the voltage on power supply line $V_{ddm}$, power supply voltages that bias memory cells in their corresponding memory array blocks $26_0$ through $26_3$.

Figure 1A:
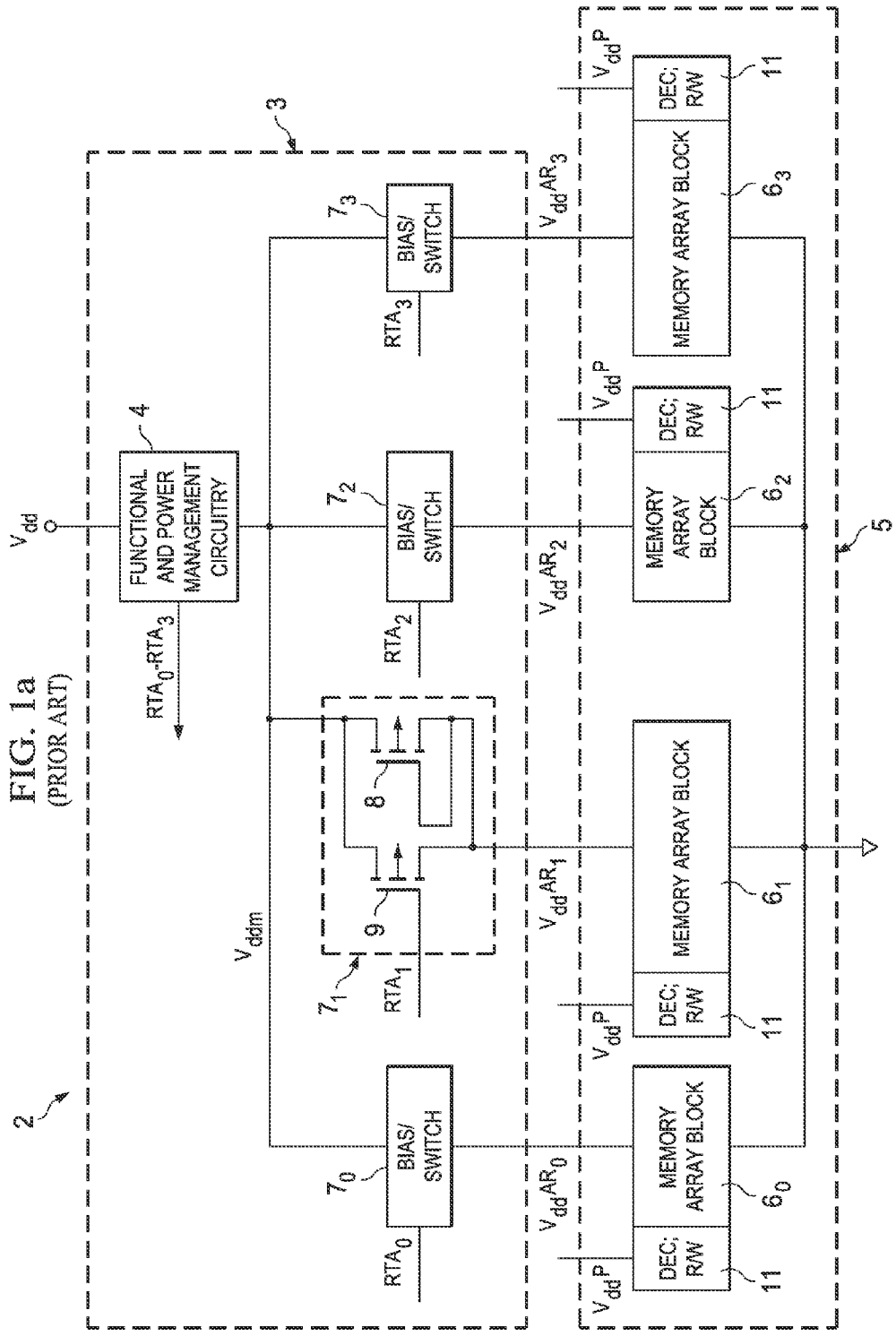
FIG. 1a is an electrical diagram, in block form, of a conventional integrated circuit including a memory array.
Figure 1B:
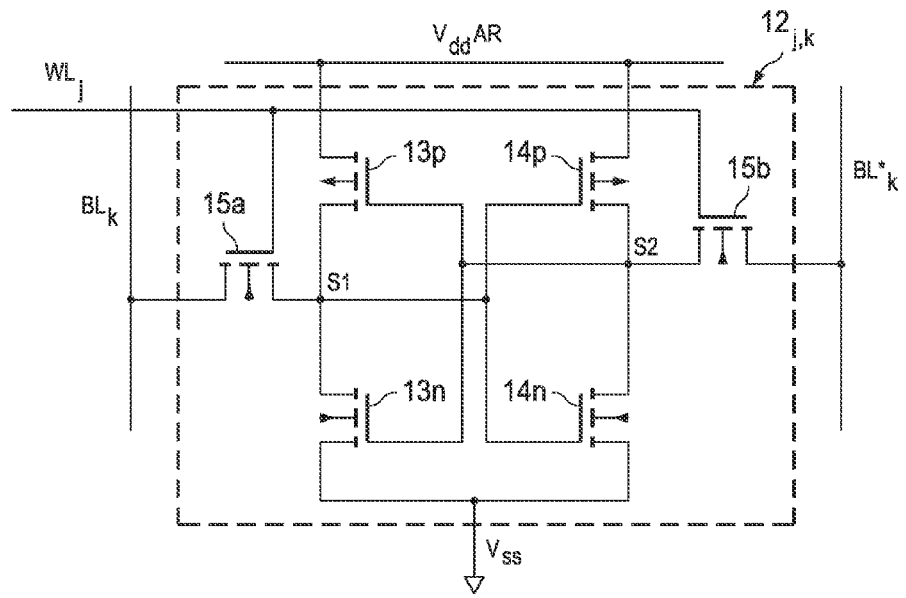
Figure 1D:
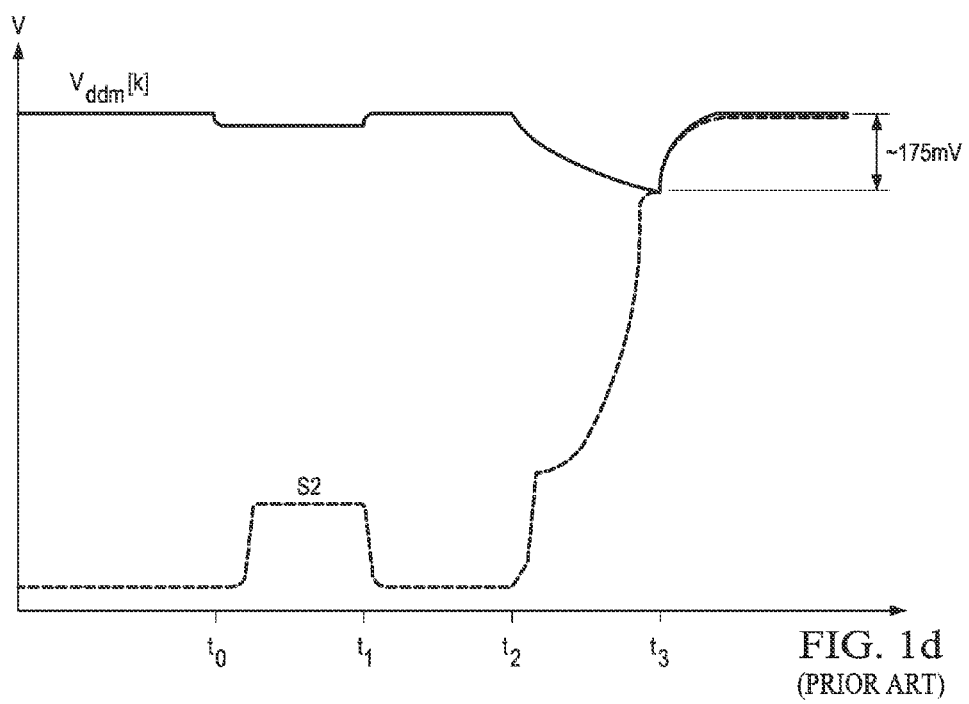
FIG. 1d is a timing diagram illustrating the operation of the conventional write assist circuitry of FIG. 1c.
Figure 1C:
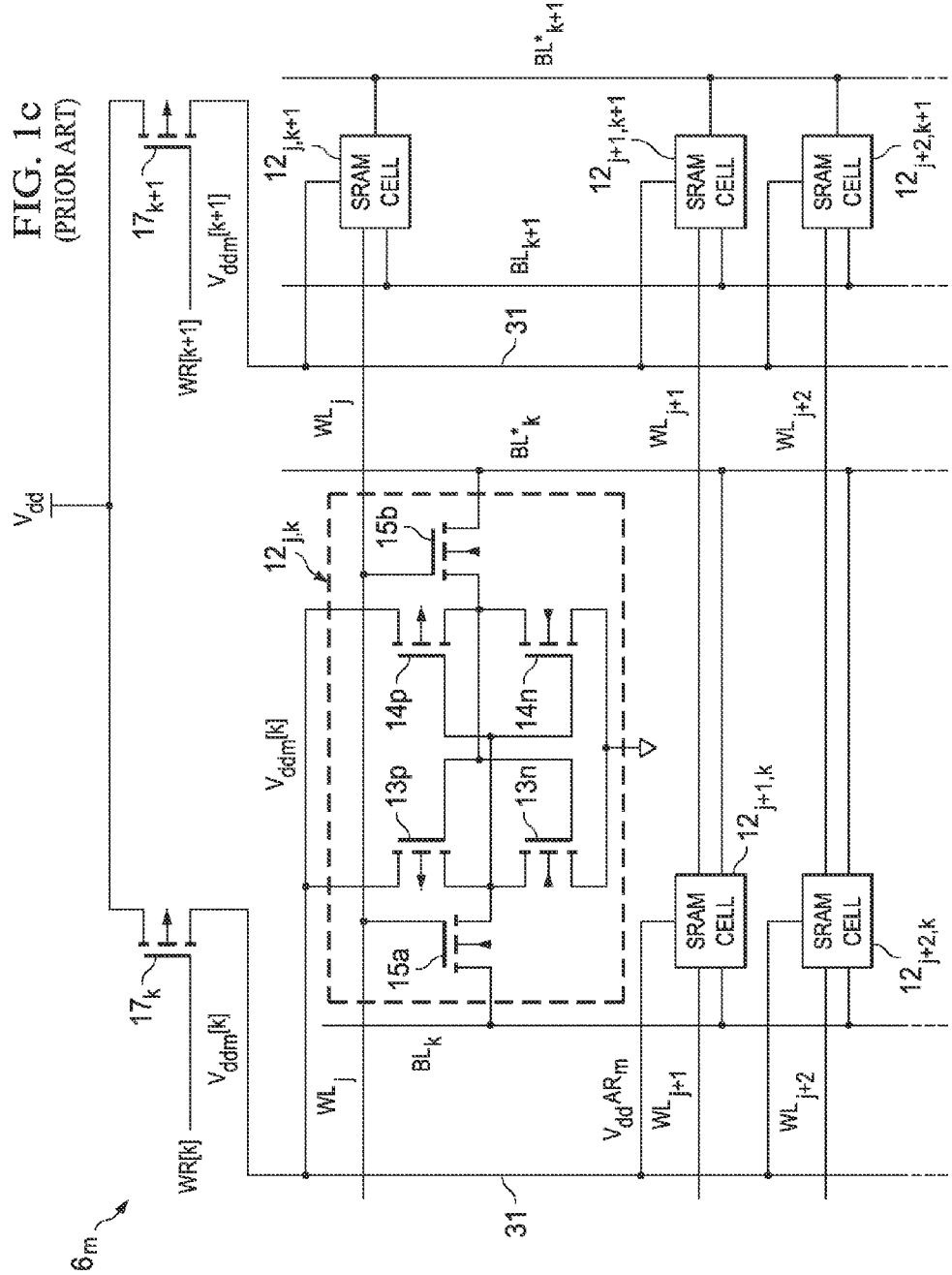
FIG. 1c is an electrical diagram, in schematic form, of the implementation of conventional write assist circuitry in a memory array.

According to embodiments of this invention, memory array blocks 26 are each constructed as conventional CMOS static random access memory (RAM) memory cells, arranged in rows and columns. These memory cells may be constructed as conventional 6-T CMOS SRAM cells, as described above in connection with FIG. 1b. Alternatively, the memory cells of memory array blocks 26 may be more complex 8-T CMOS SRAM cells in which separate read and write paths are provided, or constructed according to other conventional SRAM techniques, including those with passive load devices.

According to embodiments of this invention, bias devices $27_0$ through $27_3$ associated with respective memory array blocks $26_0$ through $26_3$ enable a retain-till-accessed (RTA) operating mode, in which the power supply voltage biasing each memory cell within a memory array block $26_i$ placed into RTA mode is reduced to a level above the data retention voltage (DRV), but in which its associated peripheral circuitry such as decoder circuitry $21_i$ and read/write circuitry $28_m$ remains fully biased. Memory array blocks $26_0$ through $26_3$ can be separately placed into and taken out of RTA mode, by way of corresponding control signals $RTA_0$ through $RTA_3$ generated by power management circuitry 24. In addition, also according to embodiments of this invention, bias devices 27 also selectively enable a write assist bias to one or more columns within corresponding memory array blocks 26, to provide improved operating margin in write operations to memory cells in those columns.

Figure 2B:
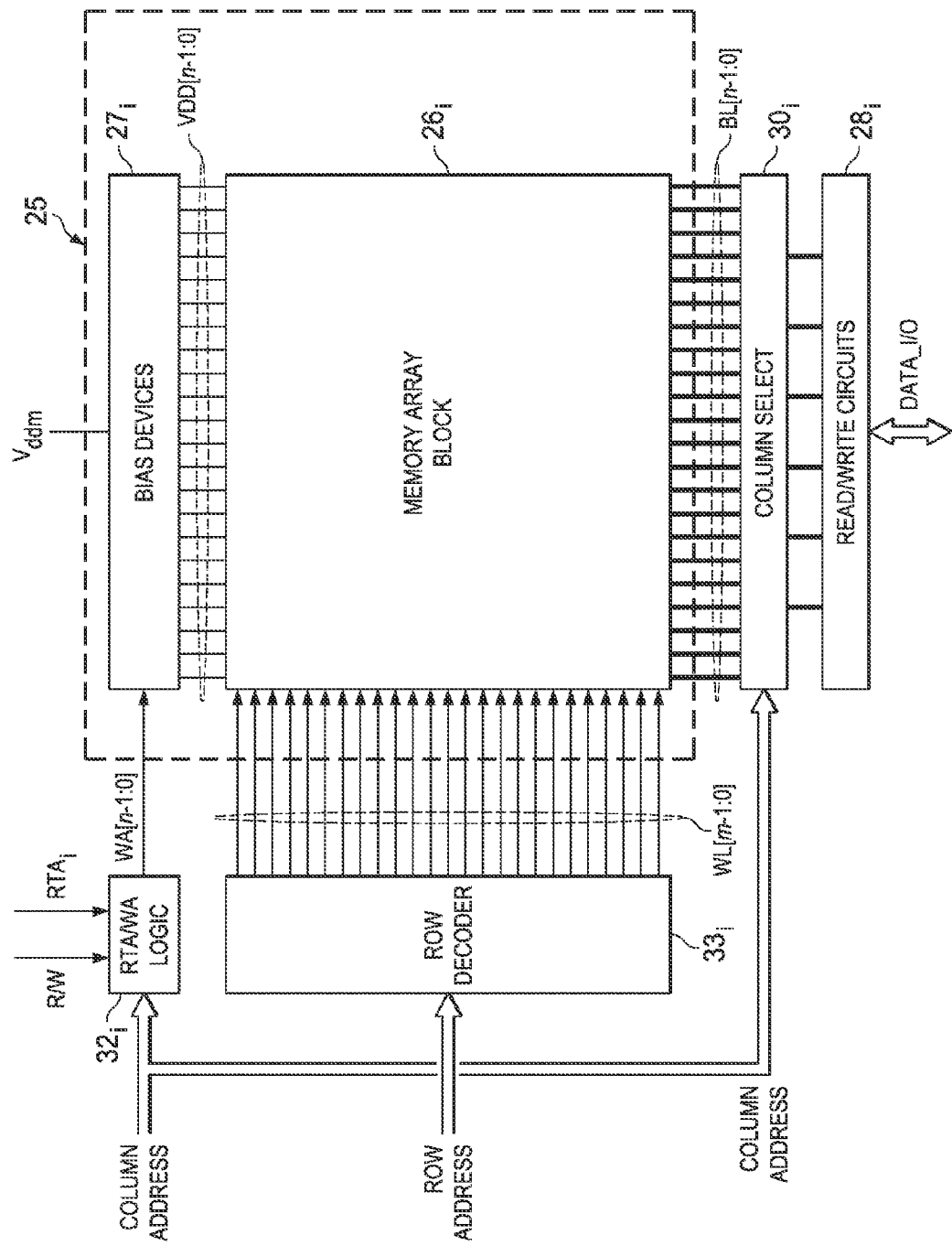

FIG. 2b illustrates the architecture of memory array blocks $26_0$ through $26_3$, by way of an example memory array block $26_i$ along with its associated peripheral circuitry. It is contemplated that each of memory array blocks $26_0$ through $26_3$ in integrated circuit 20 will be constructed according to the same architecture as one another, for simplicity of design and manufacture.

As conventional in the art, memory array block $26_i$ includes SRAM memory cells arranged in rows and columns. In this example, memory array block $26_i$ is arranged as m rows and n columns, with memory cells in the same column sharing a pair of bit lines BL[n−1:0], and with memory lines in the same row sharing one of word lines WL[m−1:0]. Row decoder $33_i$ receives a row address value indicating the row of memory array block $26_i$ to be accessed, and energizes the one of word lines WL[m−1:0] corresponding to that row address value.

A column address value is received by column select circuits $30_i$, which in turn select and forward one or more pairs of bit lines BL[n−1:0] to read/write circuits $28_i$, which may be realized as conventional sense amplifiers and write circuits as known in the art for SRAM devices. In this architecture, as will be described in further detail below, each of read/write circuits $28_i$ is shared by a group of adjacent columns, such that a portion of the column address selects which column in each group of columns is to be coupled to the shared read/write circuit $28_i$ by column select circuits $30_i$ (e.g., by way of the column decode and multiplexer functions within column select circuits $30_i$). In this specific example, four columns share each instance of read/write circuits $28_i$, such that two bits of the column address select one column from within each group of four columns for access. Of course, variations in this architecture can also be used in connection with this embodiment of the invention, including more or fewer (as few as one) columns assigned to each instance of read/write circuits $28_i$. Further in the alternative, a column decoder shared by all memory array blocks 26 may decode the column address, in which case column select circuits $30_i$ can be realized by a bank of multiplexers; these and other alternative decode and column select approaches are suitable for use in connection with this embodiment of the invention. In any event, the remainder of the column address will, of course, further select from among the accessed columns, depending on the particular architecture of memory array block $26_i$. Read/write circuits $28_i$ are coupled to bus DATA_I/O, by way of which output data and input data are communicated from and to read/write circuits $28_i$ in the conventional manner.

As shown in FIGS. 2a and 2b and as described above, bias devices $27_i$ are associated with memory array block $26_i$, and control the power supply voltage applied to memory cells in that memory array block $26_i$ in various operating and standby modes. Bias devices $27_i$ in this embodiment of the invention receive a power supply voltage on line $V_{ddm}$, from which voltages are generated and applied to memory array block $26_i$ via lines VDD[m–1]. According to embodiments of this invention, bias devices $27_i$ are capable of providing reduced power supply voltages to memory array block $26_i$ in both an RTA or other power down mode, as well as in write cycles to provided a write assist function. In the architecture shown in FIG. 2b, RTA/WA logic $32_i$ is provided in association with memory array block $26_i$, and generates control signals WA[n–1:0] to bias devices $27_i$ based on a combination of a portion of the column address, an RTA control signal $RTA_i$ generated by power management circuitry 24 (FIG. 2a) for memory array block $26_i$, and read/write control signal R/W received from functional circuitry 23 or elsewhere in integrated circuit 20 that indicates whether a read or write cycle is being performed. As will be evident from the following description, according to embodiments of this invention, write assist bias is generated by bias devices $27_i$ for those columns to which write access may be performed; to accomplish this, RTA/WA logic $32_i$ utilizes at least a portion of the column address to generate its control signals WA[n–1:0] to individual bias devices $27_i$ associated with one or more columns of memory cells.

As mentioned above, variations to the architecture shown in FIG. 2b can be alternatively implemented, it being understood that the architecture of FIG. 2b is presented by way of example only.

The construction and operation of bias devices $27_i$ according to an embodiment of the invention will now be described with reference to FIG. 3. In this embodiment of the invention, SRAM cells 12 are constructed according to the conventional 6-T approach described above relative to FIG. 1b; the same reference numerals are used for components of SRAM cell $12_{j,k}$ of FIG. 3 as used in FIG. 1b, and as such the construction of SRAM cell $12_{j,k}$ will not be further described. In the portion of memory array block $26_i$ of FIG. 3, SRAM cells 12 in two columns k, k+1, and three rows j, j+1, j+2 are illustrated by way of example, it being understood that memory array block $26_i$ will likely include many more cells 12 in more columns and rows. SRAM cells 12 in the same row share the same word line (e.g., SRAM cells $12_{j,k}$ and $12_{j,k+1}$ each receive word line $WL_j$), and SRAM cells in the same column are coupled to the same bit line pair (e.g., SRAM cells $12_{j,k}$, $12_{j+1,k}$, $12_{j+2,k}$ are each connected to bit lines $BL_k$, $BL^*_k$).

Figure 3:
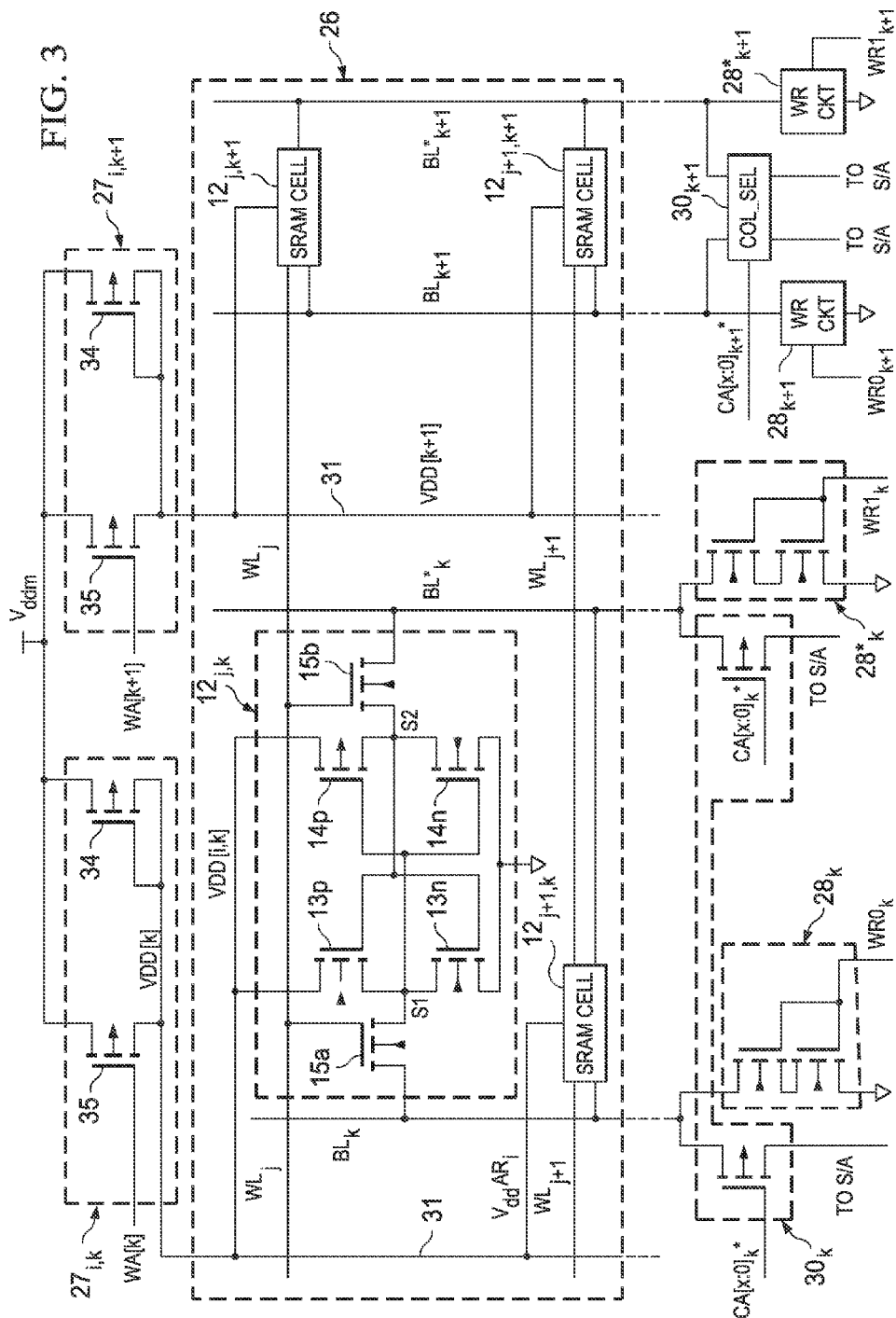
FIG. 3 is an electrical diagram, in schematic form, of the implementation of bias devices according to embodiments of this invention.

In the embodiment of the invention shown in FIG. 3, each column of SRAM cells 12 in memory array block $26_i$ is associated with an instance of a bias device $27_i$. More specifically, SRAM cells 12 that are associated with bit lines $BL_k$, $BL^*_k$ (i.e., SRAM cells 12 in column k) are associated with bias device $27_{i,k}$; similarly, SRAM cells 12 in column k+1 are associated with bias device $27_{i,k+1}$. In other words, the number of bias devices $27_i$ associated with memory array block $26_i$ equals the number of columns of SRAM cells 12 in memory array block $26_i$.

In this embodiment of the invention, each bias device $27_i$ is constructed as p-channel MOS (i.e., PMOS) transistor 34 in parallel with p-channel MOS transistor 35. Referring to bias device $27_{i,k}$ by way of example, transistor 34 is connected as a diode, with its drain and gate nodes connected to power supply line VDD[k] and its source node connected to power supply line $V_{ddm}$; transistor 35 is connected in parallel with transistor 34, with its source connected to power supply line $V_{ddm}$, its drain connected to power supply line VDD[k], and its gate receiving control line WA[k]. In the example of FIG. 3, bias device $27_{i,k+1}$ is similarly constructed and connected to power supply line VDD[k+1].

According to modern CMOS technologies, the types of transistors used to realize the memory cells in memory array blocks 26 can differ dramatically from those used elsewhere in integrated circuit 20. For example, the "array" type of transistors used in memory array blocks 26 can be of minimum feature size (i.e., channel length), and fabricated in a different manner than the "core" transistors used to realize logic and power management functionality, to minimize the chip area required for memory resources while maintaining high performance devices in the core and periphery. In contrast, core transistors are fabricated to maximize switching performance, typically at a cost of increased chip area and process complexity. For example, to minimize gate leakage, the array transistors can receive an additional fluorine implant to increase the effective gate oxide thickness (e.g., by about 1 Å), while core transistors do not receive such an implant. Conversely, to improve performance, core transistors can be fabricated using conventional strain engineering techniques (e.g., selectively depositing a tensile silicon nitride film over core NMOS transistors and a compressive silicon nitride film over core PMOS transistors), while array transistors do not receive such processing. The core and array transistors may also have significant differences in "pocket" implants that result in different threshold voltages relative to one another. As described in U.S. Patent Application Publication US 2009/0258471 A1, published Oct. 15, 2009 and entitled "Application of Different Isolation Schemes for Logic and Embedded Memory", commonly assigned with this application and incorporated herein by reference, the isolation structures and isolation doping profiles used for core transistors can differ from those used in the memory arrays, so that tighter isolation spacing and thus higher device density can be attained in memory array blocks 26. As evident from this description to those skilled in the art, these processing differences of core transistors relative to the array transistors involve structures that are relatively early in the manufacturing process (i.e., "base level" differences), rather than at the higher levels such as interconnections and metal conductor routing. As such, substantial chip area penalty would be involved if one were to construct a core transistor physically within memory array blocks 26. According to embodiments of this invention, memory array blocks 26 are realized within areas of integrated circuit 20 realized by array transistors and not core transistors; conversely, core transistors realize functional circuitry 23 and other circuit functions, and are formed in areas away from memory array blocks 26. Memory periphery functions such as decoder circuitry 21 can be constructed as core devices, for example in areas of integrated circuit 20 near or adjacent to, but outside of, corresponding memory array blocks 26.

According to embodiments of this invention, either or both of transistors 34, 35 in bias devices 27 may be fabricated as array transistors, which enables their placement within the physical area in which corresponding memory array blocks 26 are formed (i.e., memory array region 25 of FIG. 2b), and enables good matching of the reduced bias with the memory cell devices. For example, it is contemplated that diode-connected transistors 34 may be constructed as array transistors, fabricated by the same process steps and process parameters as used to fabricate p-channel transistors 13p, 14p in each of SRAM cells 12. In contrast, it is contemplated that switch transistors 35 in bias devices 27 may be best constructed as core transistors, to attain the drive strength necessary to rapidly charge power supply lines VDD[k], VDD[k+1], etc. back up to the voltage at power supply line $V_{ddm}$ following a write cycle or RTA mode. From a layout standpoint, however, it may thus be beneficial to then also construct diode-connected transistors 34 as core transistors; alternatively, both transistors 34, 35 can be constructed as array transistors if matching and layout considerations are favored in a tradeoff with drive strength and switching speed. To the extent that transistors 34, 35 in bias devices $27_i$ are constructed as array transistors, these devices can be physically located within the same physical region as its memory array block $26_i$.

FIG. 3 also illustrates examples of column select circuits 30 and write circuits 28 for columns k, k+1 in this embodiment of the invention. Column select circuits $30_k$, $30_{k+1}$ are associated with columns k, k+1, respectively. In this example, bit lines are precharged to a high voltage in each cycle, which allows each of these conventional column select circuits 30 to consist simply of a p-channel transistor that connects its bit lines $BL_k$, $BL*_k$ to a sense amplifier (not shown) in response to certain bits of the column address selecting column k. In this example, decoded signals $CA_k*$, $CA_{k+1}*$ indicate, with a low logic level, selection of columns k, k+1, respectively, which connects the corresponding bit lines for the selected column to the associated sense amplifier. In this example, write circuits 28 are constructed in the conventional manner by way of two n-channel transistors connected in series between one of the bit lines and ground, with their gates connected in common to a control signal. For example, write circuit $28_k$ includes these two transistors with their series source-drain paths connected between bit line $BL_k$ and ground, and their gates receiving control signal $WR0_k$, which when at a high level, indicates that a write cycle in which the selected SRAM cell 12 in column k is to be written with a zero state (its storage node S1 is to be latched low). Write circuit $28_k*$ is similarly connected to bit line $BL*_k$, to pull it to ground to latch storage node S2 low in writing the opposite data state.

In the RTA mode for memory array block $26_i$, RTA/WA logic $32_i$ generates active high levels for signals on each of control line WA[m−1:0], including control line WA[k], WA[k+1] in FIG. 3. These levels are generated by RTA/WA logic $32_i$ in response to a corresponding control signal from power management circuitry 24 (FIG. 2), indicating that memory array block $26_i$ is to be placed into its RTA mode. In response, referring to FIG. 3 by way of example, transistor 35 in each of bias devices $27_{i,k}$, $27_{i,k+1}$ is turned off (each being p-channel MOS devices). This permits transistor 34 in each of bias devices $27_{i,k}$, $27_{i,k+1}$ to establish the power supply voltage on their corresponding lines VDD[k], VDD[k+1], which in this example is the voltage on power supply line $V_{ddm}$ less the threshold voltage drop across diode-connected transistor 34. This same power supply voltage level is similarly established for each of the m columns of memory array block $26_i$ in this RTA mode. As a result, the power consumed by SRAM cells 12 in memory array block $26_i$ is reduced by an amount corresponding to at least the square of this voltage reduction.

During the normal operating mode of memory array block $26_i$ in which read cycles are being performed, RTA/WA logic $32_i$ conversely issues inactive low levels on each of control lines WA[m−1:0]. By way of example, referring to FIG. 3, this is reflected by low logic levels on control lines WA[k], WA[k+1]. Transistor 35 in each of bias devices $27_{i,k}$, $27_{i,k+1}$ is turned on in response to this control level, shorting out transistor 34 in each of bias devices $27_{i,k}$, $27_{i,k+1}$. The power supply voltage on corresponding lines VDD[k], VDD[k+1] is thus established at the full power supply voltage at line $V_{ddm}$, which provides optimum read performance as known in the art. This same power supply voltage level is similarly established for each of the m columns of memory array block $26_i$ in this normal operating mode for read operations.

According to this embodiment of the invention, write assist is accomplished by reducing the power supply voltage on those lines VDD[k:0] for columns to which a write is being made in a memory cycle. Referring to FIG. 3 again, by way of example, the levels of control lines WA[k], WA[k+1] in a write cycle depend on the column address. In this embodiment of the invention, control lines WA[m−1:0] associated with columns in memory array block $26_i$ to which a write is being made will be driven to an active high logic level, while those control lines WA[m−1:0] for columns that are not addressed in connection with the write cycle are maintained at an inactive low level. For example, if a write is being made to column k but not to column k+1, control line WA[k] will be at a high logic level while control line WA[k+1] will be at a low logic level. As such, transistor 35 in bias device $27_{i,k}$ will be turned off while transistor 35 in bias device $27_{i,k+1}$ will remain turned on. The power supply voltage established on line VDD[k] can be pulled down from the power supply voltage at line $V_{ddm}$ by the cell 12 being written, to a voltage that is the threshold voltage of diode-connected transistor 34 below the voltage at line $V_{ddm}$. For example, with reference to FIG. 3, if a "0" state is to be written to SRAM cell $12_{j,k}$, bit line $BL_k$ will be pulled to ground by write circuit $28_k$ while pass transistor 15a is turned on. The reduced power supply voltage of line VDD[k], through the action of bias device $27_{i,k}$, reduces the drive strength of transistor 13p, which allows write circuit $28_k$ to more easily flip the state of SRAM cell $12_{j,k}$ (setting storage node S1 low, in this example) than it would be had the full power supply voltage been maintained. Meanwhile, the power supply voltage on line VDD[k+1] will remain at the voltage on line $V_{ddm}$ by virtue of shorting transistor 35 remaining on. Accordingly, a reduced write assist bias is available to column k in which the addressed cells being written reside, providing improved write margin to a weak cell in that column, while the full $V_{dd}$ power supply voltage is applied to column k+1 and other columns in memory array block $26_i$ that are not addressed in the current write cycle.

As evident from this description of this embodiment of the invention, RTA/WA logic $32_i$ essentially consists of logic circuitry for combining a portion of the column address (as decoded), with control signal $RTA_i$ for its memory array block $32_i$, along with a control signal (not shown) indicating whether read or write operations are taking place. It is contemplated that those skilled in the art having reference to this specification will be readily able to realize the particular logic circuitry for generating the proper level of the signals on control lines WA[m−1:0] in the various modes (e.g., normal operating mode and RTA mode), and for addressed columns to which writes are being performed in the normal operating mode, without undue experimentation.

In addition, it is contemplated that those artisans will also incorporation the appropriate timing control for those signals on control lines WA[m−1:0] as best appropriate for the operation of the memory in particular implementations. In addition, it is contemplated that other circuit control functions can be implemented, for example circuitry to boost the voltage on power supply line $V_{ddm}$ at the beginning of a cycle, to discharge the voltage on power supply line $V_{ddm}$ at the end of a cycle, and the like. In addition, control circuitry within RTA/WA logic $32_i$ or elsewhere for enabling and disabling the write assist feature can be provided.

It has been observed that the combined write assist and RTA bias control of this embodiment of the invention provides important advantages over conventional bias schemes in SRAM memories. First, this embodiment of the invention provides an efficient way of incorporating both RTA mode bias and write assist into an SRAM memory, such efficiency resulting from the dual use of bias devices 27 to define both of these bias modes. It has also been observed, in connection with this invention, that significant power savings are attained by virtue of this write assist scheme. As described above, the write assist bias voltage is defined by a diode voltage drop from the $V_{dd}$ power supply. However, the extent to which the voltage on lines VDD[m−1:0] drops in the write assist mode depends on the current drawn by the addressed memory cells in the selected columns. "Strong" cells, in the sense that the cells are easily written to the opposite state, will readily change state without substantially pulling current from power supply line $V_{ddm}$, and thus without appreciably dropping the voltage on the corresponding line VDD[m−1:0], thus reducing the power consumed in re-charging lines VDD[m−1:0] for the selected columns. Only those columns containing "weak" cells that do not change state in a write operation until the bias voltage has been pulled down will result in power consumption after the write operation. As such, the operation of this embodiment of the invention is, in large part, self-regulating, reducing the power consumed in carrying out its write operations. In addition, because full power supply voltages remain for unselected columns, the likelihood of write disturb effects erroneously changing the stored state in SRAM cells 12 in those columns is reduced.

It is contemplated that alternative implementations of bias devices $27_i$ can be used in connection with embodiments of this invention. For example, while transistors 34, 35 shown above are realized as p-channel MOS transistors, it is contemplated that either or both of these devices may be realized as n-channel MOS transistors, with the gate connections and control logic modified accordingly. Furthermore, it is contemplated that the gates of transistors 34 may alternatively receive a reference voltage, such as a bandgap reference voltage generated within power management circuitry 24 or elsewhere, in order to establish the voltage drop across those devices in RTA and write assist mode (rather than basing that drop on the diode threshold voltage). Further in the alternative, it is contemplated that multiple such transistors 34 may be connected in series between power supply lines $V_{ddm}$ and VDD[k], depending on the desired voltage drop in RTA and write assist modes. It is contemplated that these and other alternatives will be apparent to those skilled in the art having reference to this specification.

As suggested in FIG. 3, each column in memory array block $26_i$ is associated with its own bias device $27_i$. This arrangement is illustrated further in FIG. 4a for a case in which four adjacent columns in memory array block 26 (described in terms of a single memory array block in this example, for clarity) share a single read/write circuit 28. Memory array block 26 in the example of FIG. 4a includes SRAM cells 12 arranged in four rows and eight columns. In this example, as typical in modern SRAMs, each column of SRAM cells 12 share a differential pair of bit lines, for example bit lines $BL_0$, $BL^*_0$ are connected to each of SRAM cells in column 0 of memory array block 26. Each group of four columns shares an instance of read/write circuits 28; in this example, columns 0 through 3 share read/write circuit 28_0, while columns 4 through 7 share read/write circuit 28_1. 4:1 column select circuits 30_0, 30_1 receive the two least significant column address bits CA[1:0], and in response to that value, select one of their four associated columns for communication with read/write circuits 28_0, 28_1, respectively, in each access cycle.

Figure 4A:
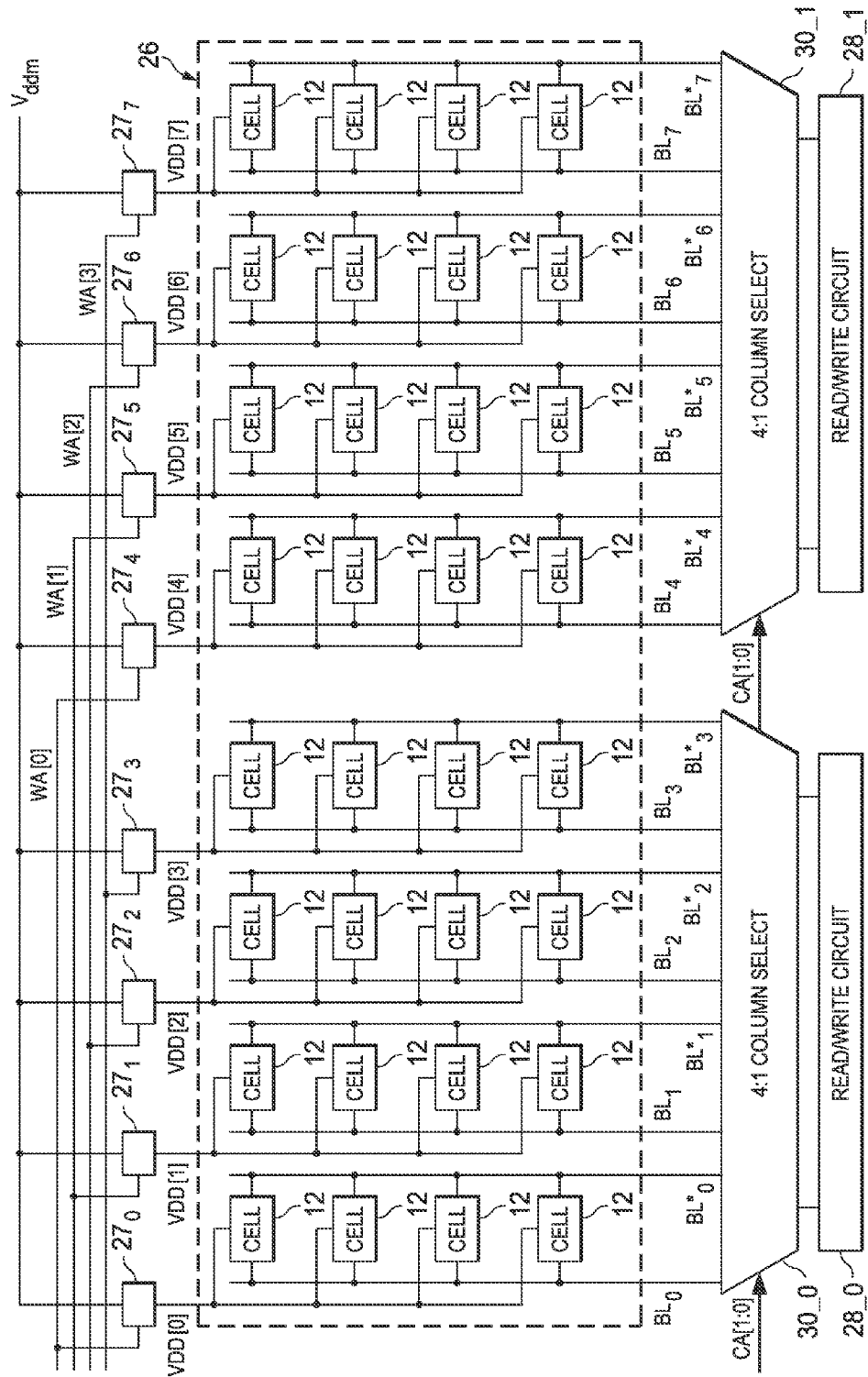
FIG. 4a is an electrical diagram, in block form, illustrating a memory array and associated bias devices according to an embodiment of the invention.

In the arrangement of FIG. 4a, each column of SRAM cells is associated with a corresponding one of bias devices 27. Specifically, bias devices $27_0$ through $27_7$ establish the power supply bias on respective power supply lines VDD[0] through VDD[7], based on the voltage at power supply line $V_{ddm}$. Because of the sharing of read/write circuits 28 by the columns of memory array 26 in this example, however, control signals on lines WA[k] are more efficiently generated and communicated. Specifically, bias devices $27_0$ and $27_4$ are controlled by the same control line WA[0]; similarly, bias devices $27_1$ and $27_5$ are controlled by control line WA[1], and so on through bias devices $27_3$ and $27_7$ being controlled by control line WA[7].

The operation of bias devices 27 in the arrangement of FIG. 4a follows that described above in connection with FIG. 3. In RTA mode, RTA/WA logic 32 drives all control lines WA[k] active high, to apply the reduced power supply voltage for that mode on power supply lines VDD[7:0]. In write cycles, however, RTA/WA logic 32 generates control signals on lines WA[k] in response to the same two column address bits (e.g., CA[1:0]) that control each column select 30 to select a column from its group of four, in the current cycle. Accordingly, because one column in each group of four columns is selected in each cycle, the same control line WA[k] can be used to control one of bias devices 27 in each group of columns, and does so in the arrangement of FIG. 4a. This reduces the number of control lines WA[k] from one per column, to the number of columns (m) divided by the number of columns per group. Layout efficiency of bias devices 27 and the corresponding control lines WA[k] is thus enhanced.

Figure 4B:
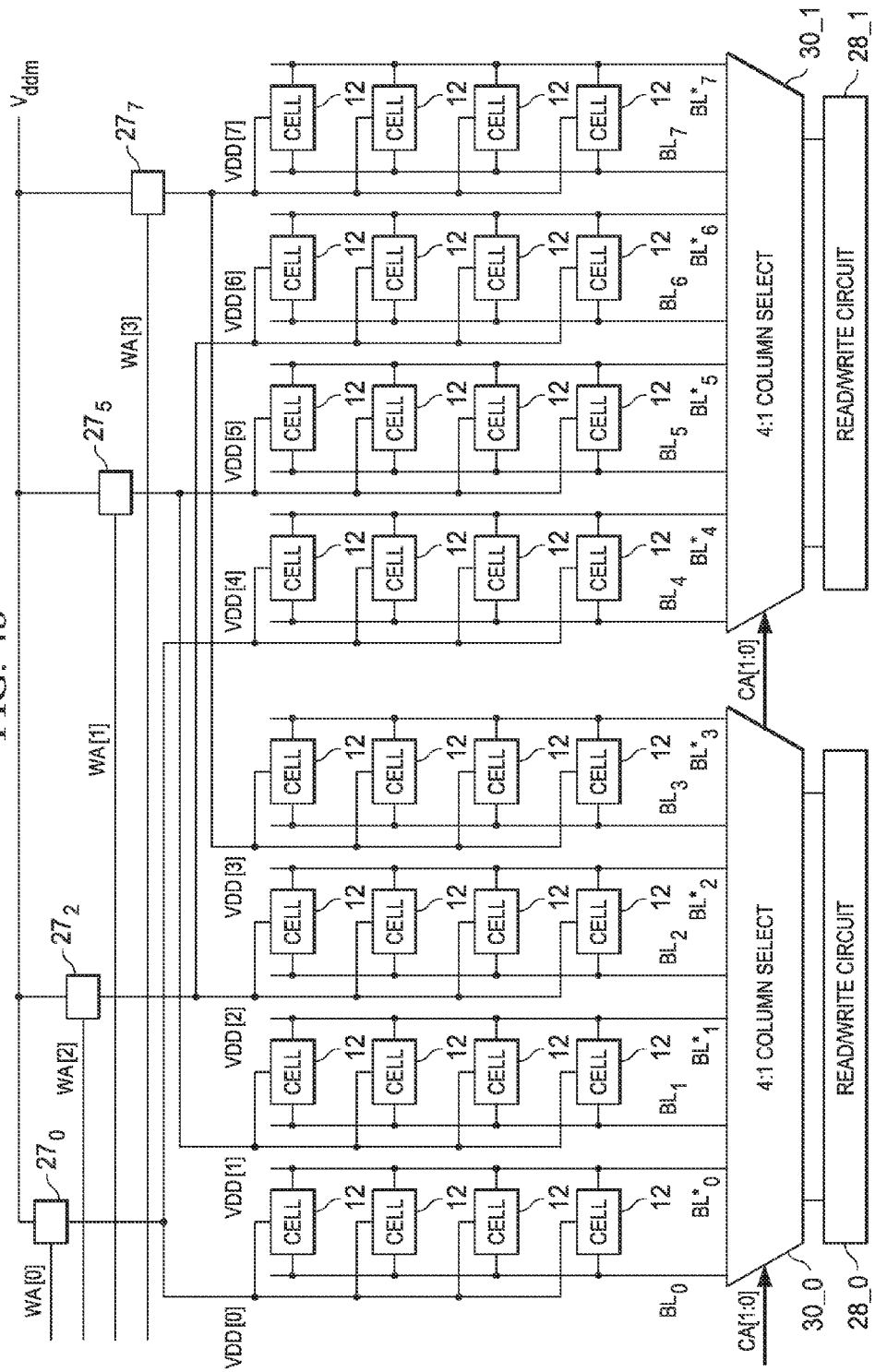
FIG. 4b is an electrical diagram, in block form, illustrating a memory array and associated bias devices according to another embodiment of the invention.

FIG. 4b illustrates an alternative implementation of the architecture of a memory array block 26 and its bias devices 27, in which further layout efficiency is attained. The arrangement of rows and columns of SRAM cells 12, and corresponding column select circuits 30 and read/write circuits 28 in FIG. 4b follows that described above relative to FIG. 4a. In the example of FIG. 4b, a single bias device 27 supports multiple columns, specifically one column in each of a number of groups. As shown in FIG. 4b, bias device $27_0$ establishes the power supply voltage on lines VDD[0] and VDD[4], bias device $27_1$ establishes the power supply voltage on lines VDD[1] and VDD[5], bias device $27_2$ establishes the power supply voltage on lines VDD[2] and VDD[6], and bias device $27_3$ establishes the power supply voltage on lines VDD[3] and VDD[7]. Control lines WA[0] through WA[3] are connected to bias devices $27_0$ through $27_3$, respectively.

The operation of the arrangement of FIG. 4b follows that described above for FIG. 4a, with the exception being that a single bias device 27 supports multiple columns. As a result, the layout efficiency is improved still further, by reducing the number of bias devices 27 required for a memory array block 26 from one per column, to the number of columns (m) divided by the number of columns per group.

Figure 1E:
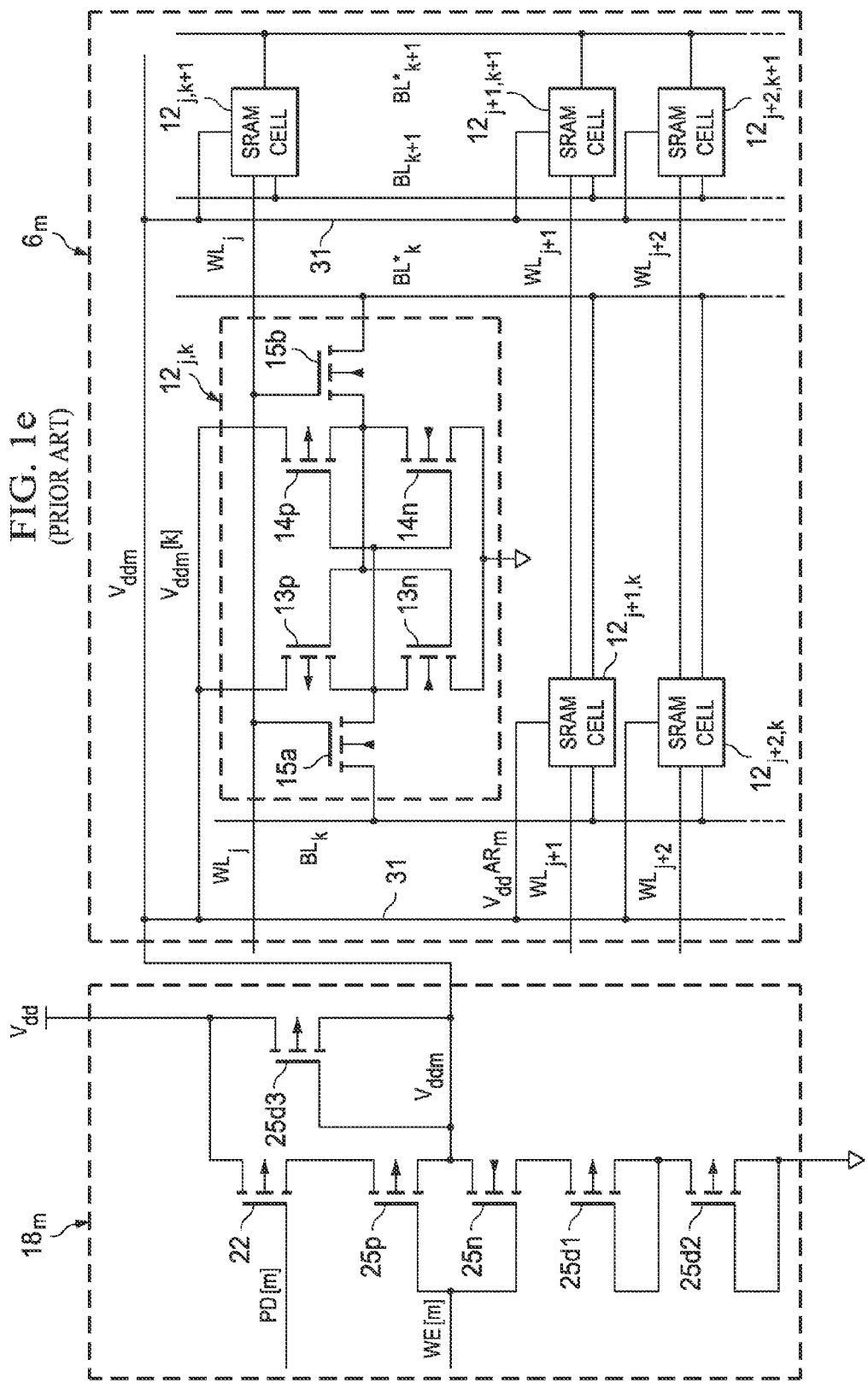
FIG. 1e is an electrical diagram, in schematic form, of the implementation of conventional write assist and power down circuitry in a memory array.

In addition, shared read/write circuit architectures such as shown in FIGS. 4a and 4b especially benefit from the reduced write disturb vulnerability provided by embodiments of the invention. In those architectures, the input data levels applied in a write operation to one column in a group by shared read/write circuit 28 can readily couple to the other, unselected, columns in that same group. For example, the pulling down of bit line BL for the selected column can couple through read/write circuit 28 to bit lines BL of other columns sharing the same read/write circuit 28. If those unselected columns were also biased by the reduced write assist power supply voltage, the possibility of an unintended write to cells 12 in unselected columns would increase. This vulnerability is present in conventional SRAM arrangements, such as those described above in connection with FIG. 1e, in which all columns in each memory array block receive the reduced write assist bias. According to the architectures of FIGS. 4a and 4b, this write disturb vulnerability is reduced because unselected columns remain biased to the full power supply voltage on line $V_{ddm}$. Accordingly, these embodiments of the invention provide excellent write performance, with minimum layout impact, and with additional protection against write disturb errors.

Figure 5A:
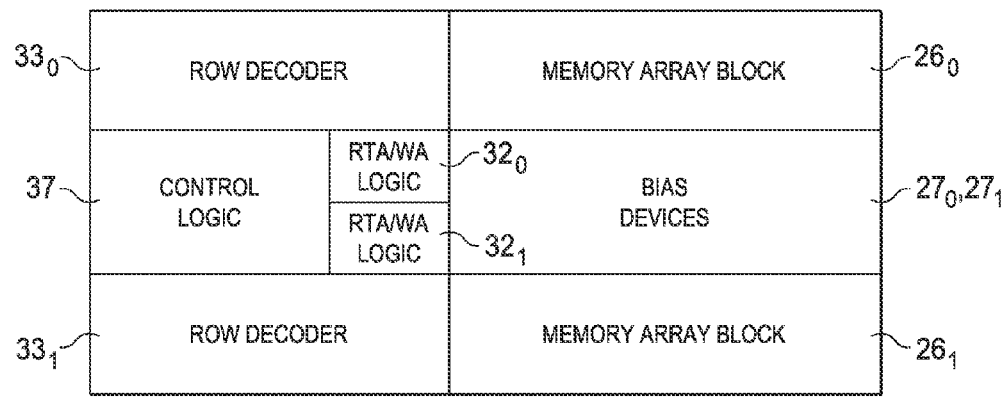
FIG. 5a illustrates, in plan view, a layout of a memory array constructed according to embodiments of this invention.
Figure 5B:
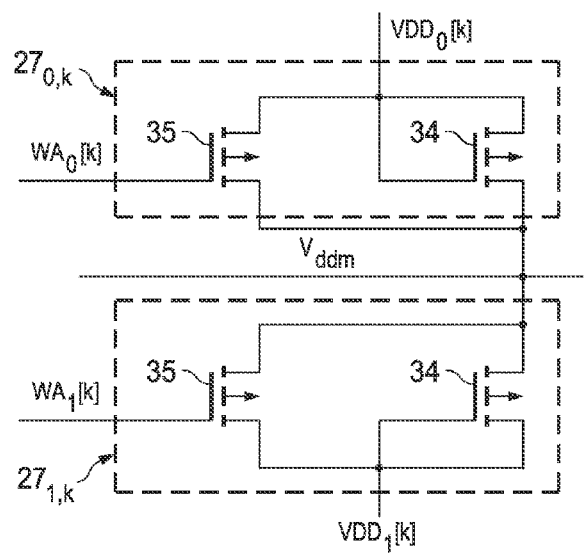
FIG. 5b is an electrical diagram, in schematic form, illustrating the sharing of conductors by bias devices in the layout of FIG. 5a, according to embodiments of this invention.

An example of a layout of memory array blocks $26_0$ and $26_k$, in combination with their corresponding bias devices $27_0$, $27_1$, is illustrated by way of FIGS. 5a and 5b. In this example, memory array blocks $26_0$, $26_1$ are of the same size as one another, in number of rows and columns. Row decoder $33_0$ is shown as disposed adjacent to, and on one end of, memory array block $26_0$; similarly, row decoder $33_1$ is placed adjacent to, and on that same end of, memory array block $26_1$. Chip area space between row decoders $33_0$, $33_1$ houses control logic 37, which refers to various control logic useful in connection with memory array blocks $26_0$, $26_1$, including RTA/WA logic circuits $32_0$, $32_1$ as shown.

In the example of FIG. 5a, the chip area space between memory array blocks $26_0$, $26_1$ is used for the placement of bias devices $27_0$, $27_1$. In this layout, this space fits within the space required for control logic 37 between row decoders $33_0$, $33_1$, thus maintaining an efficient rectangular layout. In addition, bias device sets $27_0$, $27_1$ placed between memory array blocks $26_0$, $26_1$ can share a single conductor for power supply line $V_{ddm}$, by realizing bias devices $27_0$, $27_1$ in mirror image on either side of that conductor. FIG. 5b illustrates the electrical arrangement of bias devices $27_{0,k}$, $27_{1,k}$ for a column k in respective memory array blocks $26_0$, $26_1$, suggesting this mirror image placement. Accordingly, it is contemplated that, as suggested by the example of FIGS. 5a and 5b, bias devices 27 can be efficiently implemented within chip area spaces between memory array blocks 26, consistently with the chip area required for other logic and decoder functions, for example as shown in FIGS. 5a and 5b.

Of course, it is contemplated that the particular layout and implementation details for a realization of embodiments of this invention will depend on many other factors, particularly the technology and layout requirements of the remainder of the integrated circuit. It is contemplated that those skilled in the art having reference to this specification will be readily able to place and construct these embodiments of the invention in an effective way for particular device constraints. In any event, it is contemplated that the chip area required for implementation of embodiments of this invention is relatively modest, and can be readily optimized in this manner.

Figure 6:
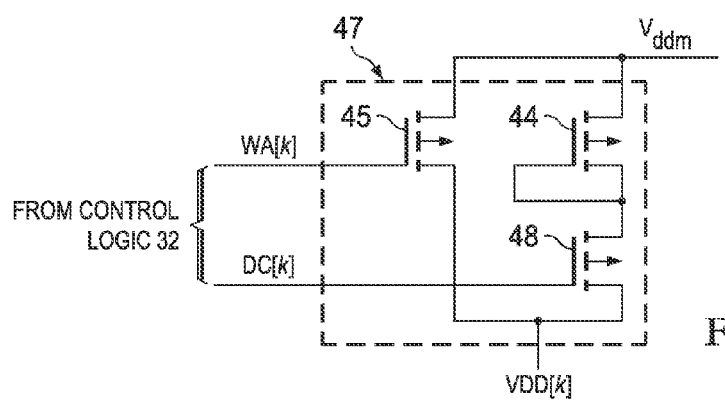
FIG. 6 is an electrical diagram, in schematic form, of a bias device according to another embodiment of this invention.

According to additional embodiments of this invention, bias devices for generating and applying RTA and write assist bias to SRAM cells can be constructed to provide additional functionality and control over the bias applied to memory array blocks. FIG. 6 illustrates one such alternative embodiment of the invention in connection with bias device 47, which additionally provides the ability to "float" the power supply lines to SRAM cells in certain operational modes.

In this embodiment of the invention, as shown in FIG. 6, bias device includes diode-connected p-channel MOS transistor 44, which as such has its source connected to power supply line $V_{ddm}$, and its gate connected to its drain. The gate and drain of transistor 44 are connected to the source of p-channel MOS transistor 48, which has its drain at power supply line VDD[k] that is applied to one or more columns of SRAM cells in a memory array block as described above. The gate of transistor 48 receives a control signal on line DC[k]. It is contemplated that logic such as RTA/WA logic 32 will generate the appropriate signals on this control line DC[k] to carry out certain functions as will be described below. P-channel transistor 45 is connected in parallel with the combination of transistors 44, 48, with its source at power supply line $V_{ddm}$, its drain at power supply line VDD[k], and its gate receiving control signals on line WA[k] as in the previously-described embodiments of the invention.

In operation, the combination of the control signals on lines WA[k], DC[k] determine the voltage at line VDD[k] as based on the voltage at power supply line $V_{ddm}$ in various operating modes. In this embodiment of the invention, the voltage at power supply line VDD[k] can be established in various operational modes according to the following truth table:

| Mode | WA[k] | DC[k] | VDD[k] level |
|---|---|---|---|
| Normal operation (read) | low | don't care | $V_{ddm}$ |
| Write assist (clamped; by column) | high | low | $V_{ddm} - V_t$ |
| RTA (by block) | high | low | $V_{ddm} - V_t$ |
| Write assist (floating; by column) | high | high | floating |
| Scratchpad power down (by block) | high | high | floating |
| Defective column disconnect (by column) | high | high | floating |

As evident from this table, certain of the operational modes are invoked for an entire memory array block $26_i$, while others are invoked on a column-by-column basis. As before, in the normal operating mode for read cycles, SRAM cells 12 in each column of memory array block $26_i$, are biased to at the full $V_{dd}$ power supply voltage at line $V_{ddm}$, by an inactive low level on line WA[k] that turns on transistor 45, shorting out transistors 44 and 48 (regardless of the state of transistor 48), and thus connecting the voltage at line $V_{ddm}$ to line VDD[k]. This read cycle bias condition is typically invoked for all columns in a given memory array block $26_i$. A clamped write assist level for line VDD[k] for an addressed column k is invoked by an active high level on control line WA[k] and an inactive low level on control line DC [k], which turns off transistor 45 but maintains transistor 48 on, which biases line VDD[k] at a threshold voltage drop below the voltage on line $V_{ddm}$. As described above, the full power supply bias (the voltage at line $V_{ddm}$) is typically maintained on power supply lines VDD[k] for unselected columns, to minimize write disturb. In RTA mode, control logic (e.g., RTA/WA logic 32) drives a high level on line WA[k] and a low level on line DC[k], but for all columns in memory array block $26_i$ (rather than only to individual columns based on the column address as in the case of the write assist mode, as described above).

The additional floating operational modes shown in the above table are made available by including transistor 48 and its control line DC[k] within bias device 47. One such mode is a floating write assist condition in which power supply line VDD[k] for the addressed columns floats. In this mode, control lines WA[k], DC[k] are both driven active high for the addressed column k, turning off both of transistors 45, 48 and isolating line VDD[k] from power supply line $V_{ddm}$. It is contemplated that this floating write assist condition would be limited in time to the duration of the write operation, at the end of which control line DC[k] would be driven low again to place the written column into RTA mode, by applying the clamped voltage $V_{ddm}-V_t$ to power supply line VDD[k], so that the newly-written data state is maintained in the addressed cells of column k. It is contemplated that those skilled in the art having reference to this specification will be readily able to implement this timing control onto control line DC[k] in cooperation with the write cycle timing, without undue experimentation. This floating write assist can assist writes to very weak cells 12, further increasing the write margin. This floating write assist mode is applied on a column-by-column basis, considering that bias should remain applied to unaddressed columns to retain stored data in those columns.

Another additional mode made available according to this embodiment of the invention is a full power-down mode, in which control lines WA[k], DC[k] are both driven active high for all columns in a memory array block $26_i$, isolating line VDD[k] from power supply line $V_{ddm}$ for the entire block. In this full power-down mode, no DC current is drawn by SRAM cells 12 in that memory array block $26_i$; of course, the data states stored in those cells are not retained, making this full power-down mode useful for such memory functions as "scratchpad" memory for which the contents need not be retained. Also shown in this table is an additional use of bias devices 47 according to this embodiment of the invention in disconnecting columns that contain defective SRAM cells 12 (and for which a "redundant" column is substituted, as known in the art). For these defective columns, power consumption is eliminated by permanently asserting control lines WA[k], DC[k] active high for the defective column k, isolating line VDD[k] from power supply line $V_{ddm}$ and thus isolating power supply bias from the cells in that column. As a result, no DC current is drawn by SRAM cells 12 in that defective column. It is contemplated that those skilled in the art having reference to this specification can readily identify additional uses and operational modes enabled by bias device 47 according to this embodiment of the invention.

Again, it is contemplated that those skilled in the art having reference to this specification will be readily able to realize RTA/WA logic 32 or other corresponding logic for generating control signals on control lines WA[k], DC [k] to transistors 45, 48 in bias devices 47 to carry out these operating modes, including the floating modes described above in connection with this embodiment of the invention. It is contemplated that inputs to such logic can include such signals as a column address portion of the memory address, read/write control signals, and an RTA mode signal from power management circuitry 24 (FIG. 2), as well as the appropriate timing and other control signals useful in realizing the bias modes enabled by this embodiment of the invention.

In addition, it is contemplated that those skilled in the art can readily identify alternative implementations of and variations to this embodiment of the invention. For example, transistors 44, 48 may be swapped in their series connection between lines $V_{ddm}$ and VDD[k], particularly if such swapping facilitates device layout within integrated circuit. Further in the alternative, one or more of transistors 44, 45, 48 in bias device 47 may be realized as n-channel MOS transistors, with the bias and control logic levels modified as a result, in the conventional manner. Furthermore, as described above, bias device 47 may be implemented one-per-column, or each instance of bias device 47 may be shared among multiple columns in a shared read/write circuit architecture, depending on the desired layout and memory architecture. It is contemplated that these and other alternatives and variations are within the scope of the invention as claimed.

Embodiments of this invention thus provide important advantages in memory design and operation. Combination of RTA and write assist devices according to embodiments of this invention provides improved control and optimized bias and operation on a column-by-column basis within such memories, in a manner that is layout efficient. The ability to realize these bias devices by way of array transistors enables their placement within the memory array region of the integrated circuit, and provides improved matching and bias optimization with the transistors of the memory cells themselves. In addition, the write assist and other operational modes are contemplated to provide improved write margin for "weak" memory cells, while minimizing vulnerability to write disturb of the stored states in columns not currently addressed.

It is contemplated that additional alternatives and variations to the embodiments of this invention described above will be apparent to those skilled in the art having reference to this specification, such alternatives and variations including the implementation of these approaches in solid-state memories of various types, constructed according to various technologies, and as may be embedded within larger-scale integrated circuits. Therefore, while the present invention has been described according to some of its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A semiconductor static random-access memory operable in read and write cycles in a normal operating mode, and operable in a retain-till-accessed (RTA) mode, the memory comprising:
a plurality of memory cells, arranged in rows and columns in at least one memory array block, each of the memory cells within a column biased from a corresponding one of a plurality of bias voltage nodes;
a first plurality of bias devices, associated with a first memory array block, each of the first plurality of bias devices associated with at least one column of memory cells in the first memory array block, each of the first plurality of bias devices comprising:
a first transistor having a conduction path connected in series between a power supply node and the bias voltage node of its associated at least one column; and
a second transistor, having a conduction path connected between the power supply node and the bias voltage node of its associated at least one column, and having a control electrode for receiving a control signal; and
control logic for generating control signals to the second transistor in each of the first plurality of bias devices so that the second transistor in each of the first plurality of bias devices is turned on in read cycles, so that the second transistor in each of the first plurality of bias devices is turned off in RTA mode for the first memory array block, and so that the second transistor in one of the first plurality of bias devices is turned off in a write cycle to a memory cell in its associated column.

2. The memory of claim 1, wherein the control logic is also for generating control signals so that, in write cycles, the second transistor in each of the first plurality of bias devices associated with unselected columns is turned on.

3. The memory of claim 1, wherein each of the first plurality of bias devices is associated with a single column of memory cells in the first memory array block.

4. The memory of claim 3, further comprising:
a first plurality of read/write circuits, each associated with a group of columns of the first memory array block; and
column select circuitry for selecting a column in each of a plurality of groups of columns of the first memory array block for communication with a corresponding one of the first plurality of read/write circuits, responsive to a portion of a column address;

wherein the gates of the second transistors of one of the first plurality of bias devices associated with each group of columns are connected in common with one another to receive control signals from the control logic.

5. The memory of claim 1, further comprising:
a first plurality of read/write circuits, each associated with a group of columns of the first memory array block; and
column select circuitry for selecting a column in each of a plurality of groups of columns of the first memory array block for communication with a corresponding one of the first plurality of read/write circuits, responsive to a portion of a column address;
wherein each of the first plurality of bias devices is associated with a plurality of columns including one column in each group of columns.

6. The memory of claim 1, wherein the first transistor in each of the first plurality of bias devices comprises a metal-oxide-semiconductor transistor with its gate connected to its drain.

7. The memory of claim 6, wherein each of the first plurality of bias devices further comprises:
a third transistor, having a conduction path connected in series with the source-drain path of the first transistor between a power supply node and the bias voltage node of its associated at least one column, and having a control electrode receiving a float control signal from the control logic.

8. The memory of claim 7, wherein the control logic is also for generating float control signals to the third transistor in each of the first plurality of bias devices so that the third transistor in each of the first plurality of bias devices is turned on in read cycles, and so that the third transistor in one of the first plurality of bias devices is turned off in a write cycle to a memory cell in its associated column.

9. The memory of claim 8, wherein the control logic is also for generating float control signals to the third transistor in each of the first plurality of bias devices so that the third transistor in each of the first plurality of bias devices is turned off in a power-down mode.

10. The memory of claim 1, wherein the at least one memory array block further comprises a second memory array block; and further comprising:
a second plurality of bias devices, associated with the second memory array block, each of the second plurality of bias devices associated with at least one column of memory cells in the second memory array block, each of the second plurality of bias devices comprising:
a first transistor having a conduction path connected in series between a power supply node and the bias voltage node of its associated at least one column; and
a second transistor, having a conduction path connected between the power supply node and the bias voltage node of its associated at least one column, and having a control electrode for receiving a control signal;
and wherein the control logic is also for generating control signals to the second transistor in each of the second plurality of bias devices so that the second transistor in each of the second plurality of bias devices is turned on in read cycles, so that the second transistor in each of the second plurality of bias devices is turned off in RTA mode for the second memory array block, and so that the second transistor in one of the second plurality of bias devices is turned off in a write cycle to a memory cell in its associated column.

11. The memory of claim 10, wherein the first and second memory array blocks are disposed at a surface of an integrated circuit near one another;
and wherein the first and second pluralities of bias devices are disposed at the surface of the integrated circuit between the first and second memory array blocks, and are both connected to a conductor corresponding to the power supply node.

12. A method of operating a memory in read and write cycles in a normal operating mode and in a retain-till-accessed (RTA) mode; wherein the memory comprises;
a plurality of memory cells, arranged in rows and columns in at least one memory array block, each of the memory cells within a column biased from a corresponding one of a plurality of bias voltage nodes; and
a first plurality of bias devices, associated with a first memory array block, each of the first plurality of bias devices associated with at least one column of memory cells in the first memory array block, each of the first plurality of bias devices comprising:
a first transistor having a conduction path connected in series between a power supply node and the bias voltage node of its associated at least one column; and
a second transistor, having a conduction path connected between the power supply node and the bias voltage node of its associated at least one column, and having a control electrode; and
the method comprising the steps of:
in read cycles in the normal operating mode for the first memory array block, turning on the second transistor in each of the first plurality of bias devices;
in the RTA mode for the first memory array block, turning off the second transistor in each of the first plurality of bias devices; and
in write cycles in the normal operating mode for the first memory array block, turning off the second transistor in one or more of the first plurality of bias devices associated with a selected column.

13. The method of claim 12, further comprising:
in write cycles in the normal operating mode for the first memory array block, turning on the second transistor in one or more of the first plurality of bias devices associated with an unselected column.

14. The method of claim 13, wherein the memory further comprises:
a first plurality of read/write circuits, each associated with a group of columns of the first memory array block; and
wherein the method further comprises:
selecting a column in each of the groups of columns of the first memory array block, responsive to a portion of a column address;
and wherein the step of turning off the second transistor in write cycles comprises turning off the second transistor of each of the first plurality of bias devices associated the selected column in each group of columns.

15. The method of claim 14, wherein each of the first plurality of bias devices is associated with a single column of memory cells in the first memory array block.

16. The method of claim 14, wherein each of the first plurality of bias devices is associated with one column in each group of columns.

17. The method of claim 12, wherein each the first plurality of bias devices further comprises:
a third transistor, having a conduction path connected in series with the source-drain path of the first transistor between a power supply node and the bias voltage node of its associated at least one column, and having a control electrode;

wherein the first transistor in each of the first plurality of bias devices is diode-connected; and wherein the method further comprises:

in read cycles in the normal operating mode for the first memory array block, turning on the third transistor in each of the first plurality of bias devices; and in write cycles in the normal operating mode for the first memory array block, turning off the second transistor in one or more of the first plurality of bias devices associated with a selected column.

18. The method of claim 17, further comprising:

in a power-down mode for the first memory array block, turning off the third transistor in each of the first plurality of bias devices.

19. The method of claim 12, wherein the memory further comprises:

a second plurality of bias devices, associated with a second memory array block, each of the second plurality of bias devices associated with at least one column of memory cells in the second memory array block, each of the second plurality of bias devices comprising:

a first transistor having a conduction path connected in series between a power supply node and the bias voltage node of its associated at least one column; and a second transistor, having a conduction path connected between the power supply node and the bias voltage node of its associated at least one column, and having a control electrode;

and wherein the method further comprises:

during read and write cycles in the normal operating mode for the first memory array block, turning off the second transistor in each of the second plurality of bias devices in the RTA mode for the second memory array block.

* * * * *